US009984788B2

(12) United States Patent
Michiaki et al.

(10) Patent No.: US 9,984,788 B2
(45) Date of Patent: May 29, 2018

(54) SILVER POWDER AND METHOD FOR PRODUCING SAME

(71) Applicant: DOWA ELECTRONICS MATERIALS CO., LTD., Tokyo (JP)

(72) Inventors: Yoshiyuki Michiaki, Tokyo (JP); Hiroshi Kamiga, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 0 days. days.

(21) Appl. No.: 15/326,536

(22) PCT Filed: Jul. 24, 2015

(86) PCT No.: PCT/JP2015/003710
§ 371 (c)(1),
(2) Date: Jan. 16, 2017

(87) PCT Pub. No.: WO2016/017128
PCT Pub. Date: Feb. 4, 2016

(65) Prior Publication Data
US 2017/0206998 A1    Jul. 20, 2017

(30) Foreign Application Priority Data

Jul. 30, 2014 (JP) ................................. 2014-154416
Jul. 22, 2015 (JP) ................................. 2015-144553

(51) Int. Cl.
*H01B 1/22* (2006.01)
*H01L 31/0224* (2006.01)
(Continued)

(52) U.S. Cl.
CPC ............. *H01B 1/22* (2013.01); *B22F 1/0062* (2013.01); *C09D 5/24* (2013.01); *C09D 101/28* (2013.01);
(Continued)

(58) Field of Classification Search
CPC .......... H01B 1/22; C09D 5/24; C09D 101/28; B22F 1/0062; B22F 2301/255;
(Continued)

(56) References Cited

U.S. PATENT DOCUMENTS

2009/0098396 A1*  4/2009  Chasser .................. C08J 3/203
                                                                428/457
2012/0064291 A1*  3/2012  Lai ....................... H01L 23/5328
                                                                428/141

FOREIGN PATENT DOCUMENTS

JP         1088206 A      4/1998
JP      2009289745 A     12/2009
(Continued)

OTHER PUBLICATIONS

International search report for application No. PCT/JP2015/003710 dated Oct. 9, 2015.

*Primary Examiner* — Caleen Sullivan
(74) *Attorney, Agent, or Firm* — Bachman & LaPointe, PC

(57) ABSTRACT

There is provided a silver powder, which is able to obtain a conductive paste having a high thixotropic ratio and a high Casson yield value and which is able to form a conductive pattern having a low resistance, and a method for producing the same. An aliphatic amine such as hexadecylamine is added to a silver powder, the surface of which is coated with a fatty acid such as stearic acid, to be stirred and mixed to form the aliphatic amine on the outermost surface of the silver powder while allowing the fatty acid to react with the aliphatic amine to form an aliphatic amide such as hexadecanamide between the fatty acid and the aliphatic amine.

23 Claims, 1 Drawing Sheet

(51) Int. Cl.
*C09D 101/28* (2006.01)
*B22F 1/00* (2006.01)
*C09D 5/24* (2006.01)
*C08K 9/04* (2006.01)

(52) U.S. Cl.
CPC  *H01L 31/022425* (2013.01); *B22F 2301/255* (2013.01); *B22F 2302/45* (2013.01); *B22F 2998/10* (2013.01); *C08K 9/04* (2013.01); *C08K 2201/001* (2013.01)

(58) Field of Classification Search
CPC ............ B22F 2998/10; B22F 2302/45; H01L 31/022425; C08K 9/04; C08K 2201/001
USPC .......................................................... 438/98
See application file for complete search history.

(56) References Cited

FOREIGN PATENT DOCUMENTS

| | | |
|---|---|---|
| JP | 2010131669 A | 6/2010 |
| JP | 2013218836 A | 10/2013 |

* cited by examiner

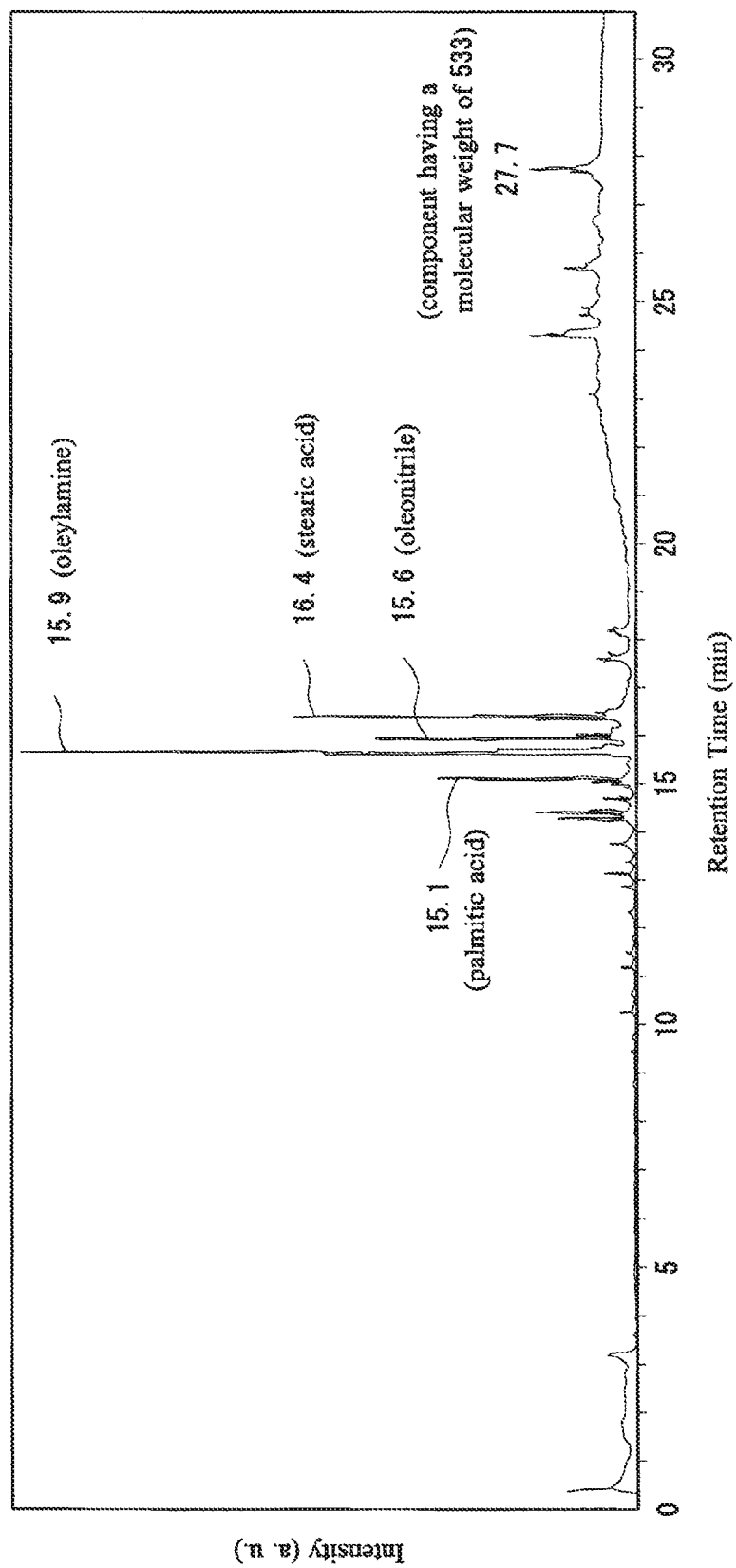

SILVER POWDER AND METHOD FOR PRODUCING SAME

TECHNICAL FIELD

The present invention relates generally to a silver powder and a method for producing the same. More specifically, the invention relates to a silver powder for a conductive paste for use in electronic parts, such as internal electrodes of laminated capacitors, conductive patterns of circuit boards, and electrodes and circuits of substrates for plasma display panels and solar cells, and a method for producing the same.

BACKGROUND ART

As a conventional conductive paste for use in electronic parts, such as internal electrodes of laminated capacitors, conductive patterns of circuit boards, and electrodes of substrates for plasma display panels, there is used a silver paste produced by kneading a mixture obtained by adding a silver powder and a glass frit to an organic vehicle. Such a silver paste is applied on a substrate and dried, and then, it is fired to form a conductive pattern.

In recent years, such electronic parts are miniaturized, so that it is required that a silver powder for a conductive paste has a reasonably small particle size and a reasonably narrow range of the particle size in order to form conductive patterns having a high density and fine lines.

As a method for producing such a silver powder for a conductive paste, there is known a method for adding an alkali or a complexing agent to an aqueous silver-salt containing solution to form a silver oxide containing slurry or an aqueous silver-complex-salt containing solution, and then, adding a reducing agent to the slurry or solution to deposit a silver powder by wet reduction.

However, there is a problem in that a silver powder produced by such a conventional method is not able to be applied to recent electronic parts, such as fine-line conductive patterns, internal electrodes of laminated capacitors, and electrodes of substrates for plasma display panels, since the silver powder is violently aggregated.

For that reason, in order to form a silver powder having small amount of aggregates and good dispersibility, there is proposed a method for forming a silver powder by adding a dispersing agent, which is at least one of fatty acids, fatty acid salts, surfactants, organic metals and protective colloids, to a silver containing slurry, which is obtained by adding an alkali or a complexing agent to an aqueous silver-salt containing solution to form a silver oxide containing slurry or an aqueous silver-complex-salt containing solution, and then, adding a reducing agent to the slurry or solution to deposit silver particles by wet reduction (see, e.g., Patent Document 1).

PRIOR ART DOCUMENT(S)

Patent Document(s)

Patent Document 1: Japanese Patent Laid-Open No. 10-88206 (Paragraph Numbers 0002-0004)

SUMMARY OF THE INVENTION

Problem to be Solved by the Invention

However, it is desired to print a conductive paste so as to form thinner lines in order to form a conductive pattern of finer lines. In order to print such a conductive paste of fine lines, it is advantageous that the thixotropic ratio (the ratio of viscosity at a low stirring speed to that at a high stirring speed) and Casson yield value (the limit value of shear stress at the flow starting) of the conductive paste are high.

It is therefore an object of the present invention to eliminate the aforementioned conventional problems and to provide a silver powder, which is able to obtain a conductive paste having a high thixotropic ratio and a high Casson yield value and which is able to form a conductive pattern having a low resistance, and a method for producing the same.

Means for Solving the Problem

In order to accomplish the aforementioned and other objects, the inventors have diligently studied and found that it is possible to produce a silver powder, which is able to obtain a conductive paste having a high thixotropic ratio and a high Casson yield value and which is able to form a conductive pattern having a low resistance, by a method for producing a silver powder, the method comprising the steps of: preparing a silver powder, the surface of which is coated with a fatty acid; adding an aliphatic amine to the silver powder; and stirring and mixing the aliphatic amine and the silver powder to form the aliphatic amine on the outermost surface of the silver powder while allowing the fatty acid to react with the aliphatic amine to form an aliphatic amide between the fatty acid and the aliphatic amine. Thus, the inventors have made the present invention.

According to the present invention, there is provided a method for producing a silver powder, the method comprising the steps of: preparing a silver powder, the surface of which is coated with a fatty acid; adding an aliphatic amine to the silver powder; and stirring and mixing the aliphatic amine and the silver powder to form the aliphatic amine on the outermost surface of the silver powder while allowing the fatty acid to react with the aliphatic amine to form an aliphatic amide between the fatty acid and the aliphatic amine.

In this method for producing a silver powder, the fatty acid is preferably stearic acid or oleic acid. The aliphatic amine is preferably at least one selected from the group consisting of isobutylamine, octylamine, decylamine, dodecylamine, hexadecylamine, octadecylamine, oleylamine, 2-ethylhexyloxypropylamine and 3-lauryloxypropylamine.

According to the present invention, there is provided a silver powder, the surface of which is coated with a fatty acid, an aliphatic amine and an aliphatic amide.

In this silver powder, the surface of the silver powder is preferably coated with the fatty acid, and the aliphatic amine is preferably formed on the outermost of the silver powder, the aliphatic amide being formed between the fatty acid and the aliphatic amine.

The fatty acid is preferably stearic acid or oleic acid. The aliphatic amine is preferably at least one selected from the group consisting of isobutylamine, octylamine, decylamine, dodecylamine, hexadecylamine, octadecylamine, oleylamine, 2-ethylhexyloxypropylamine and 3-lauryloxypropylamine.

The ratio (thixotropic ratio) of a viscosity of a kneaded mixture at 1 rpm to a viscosity of the kneaded mixture at 5 rpm is preferably 3.5 or more when the viscosities are measured at 25° C. by means of an E-type viscometer, the kneaded mixture being obtained by kneading 89.8% by weight of the silver powder, 0.6% by weight of ethyl cellulose, 6.5% by weight of texanol, 1.0% by weight of a glass frit and 2.0% by weight of zinc oxide. This kneaded mixture preferably has a Casson yield value of not less than 520 Pa·s.

Alternatively, the ratio (thixotropic ratio) of a viscosity of a kneaded mixture at 1 rpm to a viscosity of the kneaded mixture at 10 rpm is preferably 30 or more when the viscosities are measured at 25° C. by means of an E-type viscometer, the kneaded mixture being obtained by kneading 89.3 to 91.0% by weight of the silver powder, 0.6% by weight of ethyl cellulose, 1.0% by weight of a glass frit, 2.0% by weight of zinc oxide and the rest being a mixed solvent containing texanol and butyl carbitol acetate at 1:1. This kneaded mixture preferably has a Casson yield value of not less than 340 Pa·s.

According to the present invention, there is provided a conductive paste using the above-described silver powder as a conductor. Alternatively, there is provided a conductive paste comprising a solvent, a resin and a conductive powder which is the above-described silver powder.

According to the present invention, there is provided a method for producing an electrode for a solar cell, the method comprising the steps of: applying the above-described conductive paste on a surface of a substrate; and firing the conductive paste to form an electrode on the surface of the substrate.

Effects of the Invention

According to the present invention, it is possible to produce a silver powder, which is able to obtain a conductive paste having a high thixotropic ratio and a high Casson yield value and which is able to form a conductive pattern having a low resistance.

BRIEF DESCRIPTION OF THE DRAWINGS

FIG. 1 is a spectrum chart showing the results in the component analysis based on gas chromatography mass spectrometry with respect to a silver powder after treatment with amine in Example 17.

MODE FOR CARRYING OUT THE INVENTION

In the preferred embodiment of a method for producing a silver powder according to the present invention, an aliphatic amine is added to a silver powder, the surface of which is coated with a fatty acid, to be stirred and mixed to form the aliphatic amine on the outermost surface of the silver powder while allowing the fatty acid to react with the aliphatic amine to form an aliphatic amide between the fatty acid and the aliphatic amine.

The fatty acid may be propionic acid, caprylic acid, lauric acid, myristic acid, palmitic acid, stearic acid, behenic acid, acrylic acid, oleic acid, linolic acid, arachidonic acid or the like. The fatty acid is preferably stearic acid or oleic acid.

The aliphatic amine may be isobutylamine, octylamine, decylamine, dodecylamine, hexadecylamine, octadecylamine, oleylamine, 2-ethylhexyloxypropylamine, 3-lauryloxypropylamine, stearylamine or the like.

The aliphatic amide, which is formed by allowing the fatty acid to react with the aliphatic amine, is stearic amide, oleic amide, N-(2-ethylhexyl) heptane amide, hexadecanamide or the like. Furthermore, the addition of the aliphatic amine is preferably divided into several times in order to prevent coarse particles from being produced and/or to prevent the aliphatic amine formed on the outermost surface from being ununiform.

The silver powder having the aliphatic amine on the outermost surface thereof preferably has an average particle diameter of 0.1 to 5 µm (more preferably 0.5 to 3 µm) based on the laser diffraction method. If the average particle diameter based on the laser diffraction method is less than 0.1 µm, the activity of particles is high, so that it is not suitable for the firing of a firing type paste at a temperature of not lower than 500° C. when the silver powder is used for the firing type paste, although the fine silver powder is able to form fine-line conductive patterns. On the other hand, if the average particle diameter based on the laser diffraction method is larger than 5 µm, the dispersibility of the silver powder is deteriorated, so that it is difficult to form fine-line conductive patterns. The BET specific surface area of the silver powder is preferably 0.1 to 5 $m^2/g$, and more preferably 0.1 to 2 $m^2/g$. If the BET specific surface area exceeds 5 $m^2/g$, the viscosity of the paste is too high, so that the printability of the paste is deteriorated. On the other hand, if the BET specific surface area is less than 0.1 $m^2/g$, the particles are too large, so that it is difficult to form fine-line conductive patterns.

In the preferred embodiment of a silver powder according to the present invention, the surface of the silver powder is coated with (a layer of) a fatty acid, and (a layer of) an aliphatic amine is formed on the outermost surface thereof, (a layer of) an aliphatic amide being formed between (the layer of) the fatty acid and (the layer of) the aliphatic amide. The fatty acid of the silver powder, the surface of which is coated with the fatty acid such as stearic acid (the silver powder being strongly bonded to the fatty acid such as stearic acid on the surface thereof), is allowed to react with the aliphatic amine such as hexadecylamine, so that the aliphatic amine such as hexadecylamine, which is difficult to be bonded to a silver powder, can be supported on the surface of the silver powder via the aliphatic amide such as hexadecanamide (formed by the reaction of the fatty acid with the aliphatic amine). Furthermore, if the amount of the aliphatic amine, which is not supported on the silver powder, is increased, a conductive film produced by heating (firing) after printing a conductive paste, which is produced using such a silver powder, in a linear form on a substrate, has a small value of (sectional area/line width) and is disadvantageous to the formation of fine-line conductive patterns. Therefore, the amount of the aliphatic amine to be added is preferably 0.5% by weight or less and more preferably 0.33% by weight or less, with respect to the silver powder.

The ratio (thixotropic ratio) of a viscosity of a kneaded mixture at 1 rpm to a viscosity of the kneaded mixture at 5 rpm is preferably 3.5 or more (more preferably 3.7 or more) when the viscosities are measured at 25° C. by means of an E-type viscometer, the kneaded mixture being obtained by kneading 89.8% by weight of the silver powder, 0.6% by weight of ethyl cellulose, 6.5% by weight of texanol, 1.0% by weight of a glass frit and 2.0% by weight of zinc oxide. This kneaded mixture preferably has a Casson yield value of not less than 520 Pa·s and more preferably a Casson yield value of not less than 550 Pa·s.

Alternatively, the ratio (thixotropic ratio) of a viscosity of a kneaded mixture at 0.1 rpm to a viscosity of the kneaded mixture at 10 rpm is preferably 30 or more when the viscosities are measured at 25° C. by means of an E-type viscometer, the kneaded mixture being obtained by kneading 89.3 to 91.0% by weight of the silver powder, 0.6% by weight of ethyl cellulose, 1.0% by weight of a glass frit, 2.0% by weight of zinc oxide and the rest being a mixed solvent containing texanol and butyl carbitol acetate at 1:1. This kneaded mixture preferably has a Casson yield value of not less than 340 Pa·s.

Furthermore, the Casson yield value of the conductive paste can be calculated as follows. That is, when the measured values of viscosities of the conductive paste at respective revolutions are plotted on a graph having a horizontal axis denoting the shear velocity D(1/s) to the power of one half and a vertical axis denoting the shear stress τ (=viscosityη×shear velocity D) (Pa·s) to the power of one half, the gradient thereof is a Casson viscosity η∞ to the power of one half, and the intercept thereof is a Casson yield value τ0 to the power of one half, from the Casson equation $(\tau^{1/2}=\eta\infty^{1/2} \times D^{1/2}+\tau 0^{1/2})$ (η∞ denotes a Casson viscosity (a viscosity when applying an infinite shear stress (limit velocity), τ0 denotes a Casson yield value). Therefore, the Casson viscosity η∞ and the Casson yield value τ0 can be calculated from the Casson viscosity η∞ to the power of one half and Casson yield value τ0 to the power of one half, which are obtained by the plotting.

EXAMPLES

Examples of a silver powder and a method for producing the same according to the present invention will be described below in detail.

Example 1

First, 75 L of industrial ammonia water was added to 452.3 L of a silver nitrate solution containing 47.8 g/L of silver ions to form a silver ammine complex solution. The pH of the formed silver ammine complex solution was adjusted by adding 200 L of a solution containing 100 g/L of sodium hydroxide thereto. This solution was distilled by adding 350 L of water thereto, and 24.2 L of industrial formalin serving as a reducing agent was added thereto. Immediately thereafter, 360 g of an emulsion of stearic acid (the content of stearic acid=18%) was added thereto. After a silver slurry thus obtained was filtered and washed with water, it was dried to obtain 21.6 kg of a silver powder. After the surface smoothing treatment of this silver powder was carried out by means of a Henschel mixer (high-speed mixer), the classification thereof was carried out to remove large aggregates of silver being larger than 11 μm.

With respect to the substantially spherical silver powder thus obtained, the particle size distribution based on the laser diffraction method and BET specific surface area thereof were measured, and the tap density and ignition loss thereof were calculated.

The particle size distribution based on the laser diffraction method was measured by means of a micro-track particle size distribution measuring apparatus (9320HAR produced by Nikkiso Co., Ltd.) after dispersing 0.3 g of the silver powder, which was put in 30 mL of isopropyl alcohol, for 5 minutes by an ultrasonic cleaning apparatus having an output of 50 W. As a result, the particle size distribution was $D_{10}=1.1$ μm, $D_{50}=2.0$ μm and $D_{90}=3.1$ μm.

The BET specific surface area was measured, by the single point BET method based on adsorption of nitrogen, using a specific surface area measuring apparatus (Monosorb produced by Quanta Chrome Ltd.) after the silver powder was degassed at 60° C. for 10 minutes. As a result, the BET specific surface area was 0.49 m²/g.

The tap density was calculated from the expression "tap density=sample weight (15 g)/sample volume (cm³) after tapping", when 15 g of the silver powder is weighted to be put in a 20 mL test tube to be tapped 1000 times at a distance in elevation of 20 mm. As a result, the tap density was 5.8 g/cm³.

The ignition loss (Ig-loss) was obtained from the expression "ignition loss (%)=(w1−w2)×100/w1" by measuring the weight (w2) of the silver powder cooled after 3 g of the silver powder was measured (the measured weight being W1) to be put in a magnetic melting pot to be ignited at 800° C. for 30 minutes by means of an electric furnace (KM-1302 produced by Advantech Co., Ltd.). As a result, the ignition loss was 0.65%.

There was prepared 114.0 g of a hexadecylamine solution (containing 47.4% by weight of hexadecylamine) by dissolving 90% by weight of hexadecylamine (produced by Tokyo Chemical Industry Co., Ltd.) 60.0 g in ethanol (first class grade chemical produced by Wako Pure Chemical Industries, Ltd.) 54.0 g. After 15 kg of the obtained silver powder was stirred for 2 minutes by means of a Henschel mixer to carry out the preliminary surface treatment thereof, the above-described hexadecylamine solution 63.33 g (0.2% by weight of hexadecylamine with respect to the silver powder) was added to the silver powder to be stirred and mixed to carry out the surface treatment with amine, and thereafter, it was classified to remove large aggregates of silver being larger than 40 μm.

With respect to the silver powder thus treated with amine, the particle size distribution based on the laser diffraction method was measured by the same method as that for the above-described silver powder before treatment with amine, and the tap density and ignition loss thereof were calculated by the same methods as those for the above-described silver powder before treatment with amine. As a result, the particle size distribution was $D_{10}=1.1$ μm, $D_{50}=1.9$ μm and $D_{90}=2.9$ μm. The tap density was 5.0 g/cm³. The ignition loss was 0.86% which was increased by 0.21% with respect to the ignition loss of the silver powder before treatment with amine.

The silver powder after treatment with amine was observed by means of a scanning electron microscope (SEM). As a result, it was observed that the shape of the silver powder after treatment with amine was substantially spherical. Then, 2 g of the silver powder after treatment with amine and 5 mL of n-hexane were put in a 10 mL vial to be shaken for 1 minute, and then, the ultrasonication thereof was carried out for 20 minutes. Then, organic substances coating the surface of the silver powder were transferred to the hexane phase to be distributed. The component analysis of the hexane extraction liquid thus distributed was carried out by means of a gas chromatography mass spectrometer (GC-MS) (produced by Agilent Technologies Co., Ltd.). In order to carry out the quantitative analysis of stearic acid having a low sensitivity due to the high polarity thereof, the carboxyl group thereof was methylated to carry out the quantitative analysis thereof. That is, 1 mL of the above-described hexane extraction liquid was put in a 10 mL vial to be concentrated to cause the amount thereof to be less than 100 μL. Then, 1 mL of a methylating agent (a mixed solution of hydrochloric acid and methanol) was added thereto to be heated at 50° C. for 30 minutes to methylate stearic acid. Thereafter, the solution was allowed to be cooled, and 1 mL of pure water and 2 mL of n-hexane were added thereto to be shaken. Then, the hexane phase was distributed. The component analysis of the hexane extraction liquid thus distributed was carried out by means of the above-described gas chromatography mass spectrometer (GC-MS). As a result of these component analyses, hexadecanamide (formed by the reaction of stearic acid with hexadecylamine) was detected in addition to stearic acid and hexadecylamine. Then, since hexadecanamide (formed by the reaction of stearic acid with hexadecylamine) was formed by surface-treating the silver powder, the surface of which was coated with stearic acid, with hexadecylamine, it was found that (a layer of) stearic acid was formed on the surface of the silver powder, and (a layer of) hexadecylamine was formed as the outermost layer, (a layer of) hexadecanamide (formed by the reaction of stearic acid with hexadecylamine) being formed between (the layer of) stearic acid and (the layer of) hexadecylamine.

After 89.9% by weight of the silver powder after treatment with amine, 0.6% by weight of ethyl cellulose (produced by Wako Pure Chemical Industries, Ltd.), 6.5% by weight of a solvent (texanol produced by JMC Co., Ltd.), and 1.0% by weight of a glass frit (G3-5754 (Pb type) produced by Okuno Chemical Industries, Co., Ltd.) and 2.0% by weight of zinc oxide (produced by Wako Pure Chemical Industries, Ltd.) serving as additives were mixed (preliminarily kneaded) by means of a planetary centrifugal vacuum degassing mixer (Awatori Rentaro V-mini-/Mini Dappo produced by Thinky Corporation), the obtained mixture was kneaded by means of a three-roll mill (EXAKT 80S produced by Otto Hermann Inc.) to obtain a conductive paste.

The viscosity of the conductive paste thus obtained was measured at 25° C. and at 0.1 rpm, 1 rpm, 5 rpm and 10 rpm, respectively, by means of an E-type viscometer (DV-III Ultra produced by Brookfield Company). As a result, the viscosity was 2460 Pa·s, 393 Pa·s, 104 Pa·s and 42 Pa·s, respectively. The ratio (thixotropic ratio (Ti value)=Viscosity at 0.1 rpm/Viscosity at 5 rpm) (this Ti value will be hereinafter referred to as "Ti1") of the viscosity of the conductive paste at 0.1 rpm to the viscosity of the conductive paste at 5 rpm was 24. The ratio (thixotropic ratio (Ti value)=Viscosity at 0.1 rpm/Viscosity at 10 rpm) (this Ti value will be hereinafter referred to as "Ti2") of the viscosity of the conductive paste at 0.1 rpm to the viscosity of the conductive paste at 10 rpm was 59. The ratio (thixotropic ratio (Ti value)=Viscosity at 1 rpm/Viscosity at 5 rpm) (this Ti value will be hereinafter referred to as "Ti3") of the viscosity of the conductive paste at 1 rpm to the viscosity of the conductive paste at 5 rpm was 3.8.

When the measured values of viscosities of the obtained conductive paste at respective revolutions were plotted on a graph having a horizontal axis denoting the shear velocity D(1/s) to the power of one half and a vertical axis denoting the shear stress (=viscosity η×shear velocity D) (Pa·s) to the power of one half, the gradient thereof is a Casson viscosity $\eta\infty$ to the power of one half, and the intercept thereof is a Casson yield value τ0 to the power of one half, from the Casson equation ($\tau^{1/2}=\eta\infty^{1/2}\times D^{1/2}+\tau 0^{1/2}$) (η denotes the Casson viscosity (a viscosity when applying an infinite shear stress (limit velocity), τ0 denotes the Casson yield value). Therefore, the Casson viscosity $\eta\infty$ and the Casson yield value τ0 were calculated from the Casson viscosity $\eta\infty$ to the power of one half and Casson yield value τ0 to the power of one half, which were obtained by the plotting. As a result, the Casson viscosity $\eta\infty$ was 3 Pa, and the Casson yield value τ0 was 567 Pa·s.

The conductive paste thus obtained was screen-printed on a 96% alumina substrate at a squeegee pressure of 180 MPa and a printing speed of 300 mm/sec by means of a screen printing machine (MT-320T produced by Micro-tec Co., Ltd.) so as to form a coating film having a width of 50 μm×a length of 15 mm, and then, dried at room temperature. The line width of the coating film thus obtained was measured by means of a super-depth surface profile measuring microscope (VK-9700 produced by Keyence Corporation). As a result, the line width was 66.7 μm. Thus, the difference (undercut width) between the measured line width and the original line width (50 μm) was 16.7 μm, the percentage of the undercut width was 33.4% (=16.7 μm×100/50 μm), and the sectional area of the coating film was 752.2 μm². The thickness of the coating film was measured by means of a surface roughness tester (SE-30D produced by Kosaka Laboratory Ltd.). As a result, the thickness of the coating film was 20.1 μm, and the aspect ratio of the cross-section of the coating film was 0.30 (=20.1 μm/66.7 μm).

Then, the dried coating film was heated at 850° C. for 10 minutes to produce a conductive film, and the resistance of the conductive film was measured by means of a digital multi-meter (FLUKE 8840A). As a result, the resistance was 0.77Ω. The value of (resistance/sectional area) was 1.02 (mΩ/μm²) (=770 (mΩ)/752.2 (μm²)), and the value of sectional area/line width was 11.3 μm.

Example 2

The same silver powder (the silver powder before treatment with amine) as that in Example 1 was used to be surface-treated with amine by the same method as that in Example 1, except that the amount of the hexadecylamine solution to be added to the silver powder was 104.50 g (0.33% by weight of hexadecylamine with respect to the silver powder).

With respect to the silver powder thus treated with amine, the particle size distribution based on the laser diffraction method was measured by the same method as that in Example 1, and the tap density and ignition loss thereof were calculated by the same methods as those in Example 1. As a result, the particle size distribution was $D_{10}$=1.1 μm, $D_{50}$=1.9 μm and $D_{90}$=3.0 μm. The tap density was 4.6 g/cm³. The ignition loss was 1.03% which was increased by 0.38% with respect to the ignition loss of the silver powder before treatment with amine.

The silver powder after treatment with amine was analyzed by the same method as that in Example 1. As a result, it was found that stearic acid was formed on the surface of the silver powder, and hexadecylamine was formed as the outermost layer, hexadecanamide being formed between stearic acid and hexadecylamine.

The silver powder after treatment with amine was used for obtaining a conductive paste by the same method as that in Example 1. The viscosity of the conductive paste thus obtained was measured by the same method as that in Example 1, and the Casson viscosity $\eta\infty$ and Casson yield value τ0 thereof were calculated by the same methods as those in Example 1. As a result, the viscosity was 2700 Pa·s at 0.1 rpm, 405 Pa·s at 1 rpm, 104 Pa·s at 5 rpm and 44.1 Pa·s at 10 rpm, respectively, at 25° C. The value Ti1 was 26, Ti2 was 61 and Ti3 was 3.9. The Casson viscosity $\eta\infty$ was 3 Pa, and the Casson yield value τ0 was 604 Pa·s.

The conductive paste thus obtained was used for forming a coating film by the same method as that in Example 1. The width and thickness of the coating film thus formed were measured by the same methods as those in Example 1. As a result, the line width of the coating film was 68.5 μm. The difference (undercut width) between the measured line width and the original line width (50 μm) was 18.5 μm, the percentage of the undercut width was 37.0% (=18.5 μm×100/50 μm), and the sectional area of the coating film was 691.2 μm². The thickness of the coating film was 15.2 μm, and the aspect ratio of the cross-section of the coating film was 0.22 (=15.2 μm/68.5 μm). The value of (sectional area/line width) was 10.1 μm.

This coating film was used for producing a conductive film by the same method as that in Example 1. The resistance of the conductive film thus produced was measured by the same method as that in Example 1. As a result, the resistance of the conductive film was 0.71Ω, and the value of (resistance/sectional area) was 1.03 (mΩ/μm$^2$) (=710 (mΩ)/691.2 (μm$^2$)).

Example 3

The same silver powder (the silver powder before treatment with amine) as that in Example 1 was used to be surface-treated with amine by the same method as that in Example 1, except that the amount of the hexadecylamine solution to be added to the silver powder was 158.33 g (0.5% by weight of hexadecylamine with respect to the silver powder).

With respect to the silver powder thus treated with amine, the particle size distribution based on the laser diffraction method was measured by the same method as that in Example 1, and the tap density and ignition loss thereof were calculated by the same methods as those in Example 1. As a result, the particle size distribution was $D_{10}$=1.1 μm, $D_{50}$=1.9 μm and $D_{90}$=3.0 μm. The tap density was 4.8 g/cm$^3$. The ignition loss was 1.22% which was increased by 0.57% with respect to the ignition loss of the silver powder before treatment with amine.

The silver powder after treatment with amine was analyzed by the same method as that in Example 1. As a result, it was found that stearic acid was formed on the surface of the silver powder, and hexadecylamine was formed as the outermost layer, hexadecanamide being formed between stearic acid and hexadecylamine.

The silver powder after treatment with amine was used for obtaining a conductive paste by the same method as that in Example 1. The viscosity of the conductive paste thus obtained was measured by the same method as that in Example 1, and the Casson viscosity η∞ and Casson yield value τ0 thereof were calculated by the same methods as those in Example 1. As a result, the viscosity was 2820 Pa·s at 0.1 rpm, 405 Pa·s at 1 rpm, 106 Pa·s at 5 rpm and 45.6 Pa·s at 10 rpm, respectively, at 25° C. The value Ti1 was 27, Ti2 was 62 and Ti3 was 3.8. The Casson viscosity η∞ was 3 Pa, and the Casson yield value τ0 was 616 Pa·s.

The conductive paste thus obtained was used for forming a coating film by the same method as that in Example 1. The width and thickness of the coating film thus formed were measured by the same methods as those in Example 1. As a result, the line width of the coating film was 66.7 μm. The difference (undercut width) between the measured line width and the original line width (50 μm) was 16.7 μm, the percentage of the undercut width was 33.4% (=16.7 μm×100/50 μm), and the sectional area of the coating film was 522.4 μm$^2$. The thickness of the coating film was 15.6 μm, and the aspect ratio of the cross-section of the coating film was 0.23 (=15.6 μm/66.7 μm). The value of (sectional area/line width) was 7.8 μm.

This coating film was used for producing a conductive film by the same method as that in Example 1. The resistance of the conductive film thus produced was measured by the same method as that in Example 1. As a result, the resistance of the conductive film was 0.79Ω, and the value of (resistance/sectional area) was 1.51 (mΩ/μm$^2$).

Comparative Example 1

The same silver powder (the silver powder before treatment with amine) as that in Example 1 was used for obtaining a conductive paste by the same method as that in Example 1. The viscosity of the conductive paste thus obtained was measured by the same method as that in Example 1, and the Casson viscosity η∞ and Casson yield value τ0 were calculated by the same methods as those in Example 1. As a result, the viscosity was 1190 Pa·s at 0.1 rpm, 381 Pa·s at 1 rpm, 178 Pa·s at 5 rpm and 69.9 Pa·s at 10 rpm, respectively, at 25° C. The value Ti1 was 7, Ti2 was 17 and Ti3 was 2.1. The Casson viscosity η∞ was 33 Pa, and the Casson yield value τ0 was 289 Pa·s.

The conductive paste thus obtained was used for forming a coating film by the same method as that in Example 1. The width and thickness of the coating film thus formed were measured by the same methods as those in Example 1. As a result, the line width of the coating film was 72.4 μm. The difference (undercut width) between the measured line width and the original line width (50 μm) was 22.4 μm, the percentage of the undercut width was 44.8% (=22.4 μm×100/50 μm), and the sectional area of the coating film was 577.3 μm$^2$. The thickness of the coating film was 14.6 μm, and the aspect ratio of the cross-section of the coating film was 0.20 (=14.6 μm/72.4 μm). The value of (sectional area/line width) was 8.0 μm.

This coating film was used for attempting to produce a conductive film by the same method as that in Example 1. Since the conductive film was not good, it was not possible to measure the resistance of the conductive film due to the breakdown thereof.

Comparative Example 2

A silver powder surface-treated was produced by the same method as that in Example 2, except that there was prepared a stearic amide solution which was obtained by mixing a stearic acid solution, which was obtained by dissolving 223.8 g of stearic acid (produced by Wako Pure Chemical Industries, Ltd.) in 225.0 g of ethanol, with a hexadecylamine solution which was obtained by dissolving 250.0 g of hexadecylamine in 225.0 g of ethanol, and that 78.3 g of this stearic amide solution was substituted for the hexadecylamine solution.

With respect to the silver powder thus treated with amide, the particle size distribution based on the laser diffraction method was measured by the same method as that in Example 1, and the tap density and ignition loss thereof were calculated by the same methods as those in Example 1. As a result, the particle size distribution was $D_{10}$=1.1 μm, $D_{50}$=1.9 μm and $D_{90}$=2.9 μm. The tap density was 4.5 g/cm$^3$. The ignition loss was 0.93% which was increased by 0.28% with respect to the ignition loss of the silver powder before treatment with amide.

The silver powder after treatment with amide was used for obtaining a conductive paste by the same method as that in Example 1. The viscosity of the conductive paste thus obtained was measured by the same method as that in Example 1, and the Casson viscosity η∞ and Casson yield value τ0 thereof were calculated by the same methods as those in Example 1. As a result, the viscosity was 2380 Pa·s at 0.1 rpm, 433 Pa·s at 1 rpm, 132 Pa·s at 5 rpm and 67.5 Pa·s at 10 rpm, respectively, at 25° C. The value Ti1 was 18, Ti2 was 35 and Ti3 was 3.3. The Casson viscosity η∞ was 13 Pa, and the Casson yield value τ0 was 500 Pa·s.

The conductive paste thus obtained was used for forming a coating film by the same method as that in Example 1. The width and thickness of the coating film thus formed were measured by the same methods as those in Example 1. As a result, the line width of the coating film was 72.4 μm. The difference (undercut width) between the measured line width and the original line width (50 μm) was 22.4 μm, the percentage of the undercut width was 44.8% (=22.4 μm×100/50 μm), and the sectional area of the coating film was 653.9 μm². The thickness of the coating film was 17.2 μm, and the aspect ratio of the cross-section of the coating film was 0.24 (=17.2 μm/72.4 μm). The value of (sectional area/line width) was 9.0 μm.

This coating film was used for attempting to produce a conductive film by the same method as that in Example 1. Since the conductive film was not good, it was not possible to measure the resistance of the conductive film due to the breakdown thereof.

Comparative Example 3

First, 35 L of industrial ammonia water was added to 496.8 L of an aqueous silver nitrate solution containing 0.2 mol/L of silver ions to form a silver ammine complex solution. After this silver ammine complex solution was distilled by adding 465 L of water thereto, 3.2 L of an aqueous 80% hydrazine solution serving as a reducing agent was added thereto to obtain a silver slurry which was filtered and washed with water, it was dried to obtain a silver powder.

With respect to the silver powder thus obtained, the particle size distribution based on the laser diffraction method and the BET specific surface area were measured by the same methods as those in Example 1, and the tap density and ignition loss thereof were calculated by the same methods as those in Example 1. As a result, the particle size distribution was $D_{10}$=6.9 μm, $D_{50}$=18.6 μm and $D_{90}$=39.5 μm. The BET specific surface area was 0.30 m²/g, and the tap density was 4.7 g/cm³. The ignition loss was 0.01%.

The silver powder thus obtained was surface-treated with amine by the same method as that in Example 2. With respect to the silver powder thus treated with amine, the particle size distribution based on the laser diffraction method was measured by the same method as that in Example 1, and the tap density and ignition loss thereof were calculated by the same methods as those in Example 1. As a result, the particle size distribution was $D_{10}$=3.2 μm, $D_{50}$=8.3 μm and $D_{90}$=19.1 μm. The tap density was 4.6 g/cm³. The ignition loss was 0.36% which was increased by 0.35% with respect to the ignition loss of the silver powder before treatment with amine.

The silver powder after treatment with amine was used for obtaining a conductive paste by the same method as that in Example 1. The viscosity of the conductive paste thus obtained was measured by the same method as that in Example 1, and the Casson viscosity η∞ and Casson yield value τ0 thereof were calculated by the same methods as those in Example 1. As a result, the viscosity was 953 Pa·s at 0.1 rpm, 425 Pa·s at 1 rpm, 172 Pa·s at 5 rpm and 77.4 Pa·s at 10 rpm, respectively, at 25° C. The value Ti1 was 5.5, Ti2 was 12 and Ti3 was 2.5. The Casson viscosity η∞ was 39 Pa, and the Casson yield value τ0 was 257 Pa·s.

The conductive paste thus obtained was used for forming a coating film by the same method as that in Example 1. The width and thickness of the coating film thus formed were measured by the same methods as those in Example 1. As a result, the line width of the coating film was 64.8 μm. The difference (undercut width) between the measured line width and the original line width (50 μm) was 14.8 μm, the percentage of the undercut width was 29.6% (=14.8 μm×100/50 μm), and the sectional area of the coating film was 827.0 μm². The thickness of the coating film was 21.3 μm, and the aspect ratio of the cross-section of the coating film was 0.33 (=21.3 μm/64.8 μm). The value of (sectional area/line width) was 12.8 μm.

This coating film was used for attempting to produce a conductive film by the same method as that in Example 1. Since the conductive film was not good, it was not possible to measure the resistance of the conductive film due to the breakdown thereof.

Comparative Example 4

A silver powder surface-treated was produced by the same method as that in Comparative Example 3, except that there was prepared a stearic amide solution which was obtained by mixing a stearic acid solution, which was obtained by dissolving 223.8 g of stearic acid (produced by Wako Pure Chemical Industries, Ltd.) in 225.0 g of ethanol, with a hexadecylamine solution which was obtained by dissolving 250.0 g of hexadecylamine in 225.0 g of ethanol, and that 78.3 g of this stearic amide solution was substituted for the hexadecylamine solution.

With respect to the silver powder thus treated with amide, the particle size distribution based on the laser diffraction method was measured by the same method as that in Example 1, and the tap density and ignition loss thereof were calculated by the same methods as those in Example 1. As a result, the particle size distribution was $D_{10}$=2.7 μm, $D_{50}$=7.1 μm and $D_{90}$=17.0 μm. The tap density was 4.5 g/cm³. The ignition loss was 0.93% which was increased by 0.33% with respect to the ignition loss of the silver powder before treatment with amide.

The silver powder after treatment with amide was used for obtaining a conductive paste by the same method as that in Example 1. The viscosity of the conductive paste thus obtained was measured by the same method as that in Example 1, and the Casson viscosity η∞ and Casson yield value τ0 thereof were calculated by the same methods as those in Example 1. As a result, the viscosity was 1670 Pa·s at 0.1 rpm, 380 Pa·s at 1 rpm, 133 Pa·s at 5 rpm and 75.4 Pa·s at 10 rpm, respectively, at 25° C. The value Ti1 was 13, Ti2 was 22 and Ti3 was 2.9. The Casson viscosity η∞ was 25 Pa, and the Casson yield value τ0 was 337 Pa·s.

The conductive paste thus obtained was used for forming a coating film by the same method as that in Example 1. The width and thickness of the coating film thus formed were measured by the same methods as those in Example 1. As a result, the line width of the coating film was 70.5 μm. The difference (undercut width) between the measured line width and the original line width (50 μm) was 20.5 μm, the percentage of the undercut width was 41.0% (=20.5 μm×100/50 μm), and the sectional area of the coating film was 882.7 μm². The thickness of the coating film was 13.5 μm, and the aspect ratio of the cross-section of the coating film was 0.19 (=13.5 μm/70.5 μm). The value of (sectional area/line width) was 12.5 μm.

This coating film was used for attempting to produce a conductive film by the same method as that in Example 1. Since the conductive film was not good, it was not possible to measure the resistance of the conductive film due to the breakdown thereof.

Comparative Example 5

The same silver powder (the silver powder before treatment with amine) as that in Comparative Example 3 was used for obtaining a conductive paste by the same method as that in Example 1. The viscosity of the conductive paste thus obtained was measured by the same method as that in Example 1, and the Casson viscosity η∞ and Casson yield value τ0 thereof were calculated by the same methods as those in Example 1. As a result, the viscosity was 198 Pa·s at 0.1 rpm, 333 Pa·s at 1 rpm, 169 Pa·s at 5 rpm and 48.0 Pa·s at 10 rpm, respectively, at 25° C. The value Ti1 was 1.5, Ti2 was 4 and Ti3 was 3.3. The Casson viscosity η∞ was 39 Pa, and the Casson yield value τ0 was 125 Pa·s.

The conductive paste thus obtained was used for attempting to form a coating film and to produce a conductive film by the same methods as those in Example 1. Since it was not possible to form a good linear coating film, it was not possible to measure the line width and thickness of the coating film, and it was not possible to measure the resistance of the conductive film.

The results in Examples 1-3 and Comparative Examples 1-5 are shown in Tables 1-5.

TABLE 1

| | Dispersing Agent | BET ($m^2/g$) | Tap Density ($g/cm^3$) | Ignition Loss (%) | $D_{10}$ (μm) | $D_{50}$ (μm) | $D_{90}$ (μm) |
|---|---|---|---|---|---|---|---|
| Ex. 1 | stearic acid | 0.49 | 5.8 | 0.65 | 1.1 | 2.0 | 3.1 |
| Ex. 2 | stearic acid | 0.49 | 5.8 | 0.65 | 1.1 | 2.0 | 3.1 |
| Ex. 3 | stearic acid | 0.49 | 5.8 | 0.65 | 1.1 | 2.0 | 3.1 |
| Comp. 1 | stearic acid | 0.49 | 5.8 | 0.65 | 1.1 | 2.0 | 3.1 |
| Comp. 2 | stearic acid | 0.49 | 5.8 | 0.65 | 1.1 | 2.0 | 3.1 |
| Comp. 3 | — | 0.30 | 4.7 | 0.01 | 6.9 | 18.6 | 39.5 |
| Comp. 4 | — | 0.30 | 4.7 | 0.01 | 6.9 | 18.6 | 39.5 |
| Comp. 5 | — | 0.30 | 4.7 | 0.01 | 6.9 | 18.6 | 39.5 |

TABLE 2

| | Surface Treatment Agent | | After Surface Treatment | | | | | |
|---|---|---|---|---|---|---|---|---|
| | Kind | Amount (wt %) | Tap Density ($g/cm^3$) | Ignition Loss (%) | Amount of Increase of Ignition Loss (%) | $D_{10}$ (μm) | $D_{50}$ (μm) | $D_{90}$ (μm) |
| Ex. 1 | HDA | 0.2 | 5.0 | 0.86 | 0.21 | 1.1 | 1.9 | 2.9 |
| Ex. 2 | HDA | 0.33 | 4.6 | 1.03 | 0.38 | 1.1 | 1.9 | 3.0 |
| Ex. 3 | HDA | 0.5 | 4.8 | 1.22 | 0.57 | 1.1 | 1.9 | 3.0 |
| Comp. 1 | — | — | — | — | — | — | — | — |
| Comp. 2 | SA | 0.33 | 4.5 | 0.93 | 0.28 | 1.1 | 1.9 | 2.9 |
| Comp. 3 | HDA | 0.33 | 4.6 | 0.36 | 0.35 | 3.2 | 8.3 | 19.1 |
| Comp. 4 | SA | 0.33 | 4.8 | 0.34 | 0.33 | 2.7 | 7.1 | 17.0 |
| Comp. 5 | — | — | — | — | — | — | — | — |

HAD: hexadecylamine,
SA: stearic amide

TABLE 3

| | Viscosity (Pa·s) | | | | | | | Casson Viscosity (Pa) | Casson Yield Value (Pa·s) |
|---|---|---|---|---|---|---|---|---|---|
| | 0.1 rpm | 1 rpm | 5 rpm | 10 rpm | Ti1 | Ti2 | Ti3 | | |
| Ex. 1 | 2460 | 393 | 104 | 41.7 | 24 | 59 | 3.8 | 3 | 567 |
| Ex. 2 | 2700 | 405 | 104 | 44.1 | 26 | 61 | 3.9 | 3 | 604 |
| Ex. 3 | 2820 | 405 | 106 | 45.6 | 27 | 62 | 3.8 | 3 | 616 |
| Comp. 1 | 1190 | 381 | 178 | 69.9 | 7 | 17 | 2.1 | 33 | 289 |
| Comp. 2 | 2380 | 433 | 132 | 67.5 | 18 | 35 | 3.3 | 13 | 500 |
| Comp. 3 | 953 | 425 | 172 | 77.4 | 5.5 | 12 | 2.5 | 39 | 257 |
| Comp. 4 | 1670 | 380 | 133 | 75.4 | 13 | 22 | 2.9 | 25 | 337 |
| Comp. 5 | 198 | 333 | 169 | 48.0 | 1.5 | 4 | 3.3 | 39 | 125 |

TABLE 4

| | Line Width (μm) | Undercut Width (μm) | Thickness (μm) | Aspect Ratio | Sectional Area (μm²) | Sectional Area/Line Width (μm) |
|---|---|---|---|---|---|---|
| Ex. 1 | 66.7 | 16.7 | 20.1 | 0.30 | 752.2 | 11.3 |
| Ex. 2 | 68.5 | 18.5 | 15.2 | 0.22 | 691.2 | 10.1 |
| Ex. 3 | 66.7 | 16.7 | 15.6 | 0.23 | 522.4 | 7.8 |
| Comp. 1 | 72.4 | 22.4 | 14.6 | 0.20 | 577.3 | 8.0 |
| Comp. 2 | 72.4 | 22.4 | 17.2 | 0.24 | 653.9 | 9.0 |
| Comp. 3 | 64.8 | 14.8 | 21.3 | 0.33 | 827.0 | 12.8 |
| Comp. 4 | 70.5 | 20.5 | 13.5 | 0.19 | 882.7 | 12.5 |
| Comp. 5 | unmeasurable | unmeasurable | unmeasurable | unmeasurable | unmeasurable | unmeasurable |

TABLE 5

| | Resistance (Ω) | Resistance/Sectional Area (mΩ/μm²) |
|---|---|---|
| Ex. 1 | 0.77 | 1.02 |
| Ex. 2 | 0.71 | 1.03 |
| Ex. 3 | 0.79 | 1.51 |
| Comp. 1 | unmeasurable | unmeasurable |
| Comp. 2 | unmeasurable | unmeasurable |
| Comp. 3 | unmeasurable | unmeasurable |

TABLE 5-continued

|  | Resistance ($\Omega$) | Resistance/ Sectional Area ($m\Omega/\mu m^2$) |
|---|---|---|
| Comp. 4 | unmeasurable | unmeasurable |
| Comp. 5 | unmeasurable | unmeasurable |

Example 4

First, 45 L of industrial ammonia water was added to 502.7 L of a silver nitrate solution containing 21.4 g/L of silver ions to form a silver ammine complex solution. The pH of the formed silver ammine complex solution was adjusted by adding 8.8 L of a solution containing 100 g/L of sodium hydroxide thereto. This solution was distilled by adding 462 L of water thereto, and 48 L of industrial formalin serving as a reducing agent was added thereto. Immediately thereafter, 121 g of an emulsion of stearic acid (the content of stearic acid=16%) was added thereto. After a silver slurry thus obtained was filtered and washed with water, it was dried to obtain a silver powder. After the surface smoothing treatment of this silver powder was carried out by means of a Henschel mixer (high-speed mixer), the classification thereof was carried out to remove large aggregates of silver being larger than 11 μm.

With respect to the silver powder thus obtained, the particle size distribution and the BET specific surface area were measured by the same methods as those in Example 1, and the tap density was calculated by the same method as that in Example 1. As a result, the particle size distribution was $D_{10}=1.2$ μm, $D_{50}=1.9$ μm and $D_{90}=3.1$ μm. The BET specific surface area was 0.40 $m^2/g$, and the tap density was 6.0 $g/cm^3$.

Then, 120 g of the silver powder thus obtained (the silver powder before treatment with amine) was put in a small grinder (sample mill) (produced by Kyoritsu-riko Co., Ltd.) to be preliminarily ground for 30 seconds. Then, after half of 0.06 g of isobutylamine (produced by Koei Chemical Industry Co., Ltd.) (0.05% by weight of isobutylamine with respect to the silver powder) serving as the fatty amine was added to the ground silver powder to be crashed for 30 seconds, the rest half of isobutylamine was added thereto to be crashed for 30 seconds to carry out the surface treatment with amine.

With respect to a substantially spherical silver powder thus treated with amine, the particle size distribution based on the laser diffraction method and the BET specific surface area were measured by the same methods as those for the silver powder before treatment with amine in Example 1, and the tap (TAP) density was calculated by the same method as that for the silver powder before treatment with amine in Example 1. As a result, the particle size distribution was $D_{10}=1.2$ μm, $D_{50}=1.8$ μm, $D_{90}=2.9$ μm and $D_{max}=6.5$ μm. The BET specific surface area was 0.41 $m^2/g$, and the tap density was 5.6 $g/cm^3$.

After 89.4% by weight of the silver powder after treatment with amine, 0.6% by weight of ethyl cellulose (produced by Wako Pure Chemical Industries, Ltd.), a mixed solvent containing texanol (produced by JMC Co., Ltd.) and butyl carbitol acetate (BCA) (produced by Wako Pure Chemical Industries, Ltd.) at 1:1 (the amount of each of the solvent was 3.5% by weight), and 1.0% by weight of a glass frit (G3-5754 (Pb type) produced by Okuno Chemical Industries, Co., Ltd.) and 2.0% by weight of zinc oxide (produced by Wako Pure Chemical Industries, Ltd.) serving as additives were mixed (preliminarily kneaded) by means of a planetary centrifugal vacuum degassing mixer (Awatori Rentaro V-mini-/Mini Dappo produced by Thinky Corporation), the obtained mixture was kneaded by means of a three-roll mill (EXAKT 80S produced by Otto Hermann Inc.) to obtain a conductive paste.

The viscosity of the conductive paste thus obtained was measured by the same method as that in Example 1, and the Casson viscosity η∞ and Casson yield value τ0 thereof were calculated by the same methods as those in Example 1. As a result, the viscosity was 2020 Pa·s at 0.1 rpm, 369 Pa·s at 1 rpm, 122 Pa·s at 5 rpm and 58 Pa·s at 10 rpm, respectively, at 25° C. The value Ti1 was 17, Ti2 was 35 and Ti3 was 3.0. The Casson viscosity η∞ was 12 Pa, and the Casson yield value τ0 was 427 Pa·s.

The conductive paste thus obtained was used for forming a coating film by the same method as that in Example 1. The width and thickness of the coating film thus formed were measured by means of a super-depth surface profile measuring microscope (VK-9700 produced by Keyence Corporation). As a result, the line width of the coating film was 85.8 μm, and the sectional area of the coating film was 780 $\mu m^2$. The thickness of the coating film was 16.1 μm, and the aspect ratio of the cross-section of the coating film was 0.19 (=16.1 μm/85.8 μm). The value of (sectional area/line width) was 9.1 μm.

This coating film was used for producing a conductive film by the same method as that in Example 1. The resistance of the conductive film thus produced was measured by the same method as that in Example 1. As a result, the resistance of the conductive film was 0.826Ω, and the value of (resistance/sectional area) was 1.06 ($m\Omega/\mu m^2$) (=826 (mΩ)/780 ($\mu m^2$)).

Example 5

The silver powder was surface-treated with amine by the same method as that in Example 4, except that the amount of the isobutylamine solution to be added to the silver powder was 0.6 g (0.5% by weight of isobutylamine with respect to the silver powder).

With respect to the silver powder thus treated with amine, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}=1.1$ μm, $D_{50}=1.8$ μm, $D_{90}=2.8$ μm and $D_{max}=6.5$ μm. The BET specific surface area was 0.40 $m^2/g$, and the tap density was 6.0 $g/cm^3$.

The silver powder after treatment with amine was used for obtaining a conductive paste by the same method as that in Example 4. The viscosity of the conductive paste thus obtained was measured by the same method as that in Example 1, and the Casson viscosity η∞ and Casson yield value τ0 thereof were calculated by the same methods as those in Example 1. As a result, the viscosity was 1720 Pa·s at 0.1 rpm, 310 Pa·s at 1 rpm, 94 Pa·s at 5 rpm and 53 Pa·s at 10 rpm, respectively, at 25° C. The value Ti1 was 18, Ti2 was 32 and Ti3 was 3.3. The Casson viscosity η∞ was 12 Pa, and the Casson yield value τ0 was 346 Pa·s.

The conductive paste thus obtained was used for forming a coating film by the same method as that in Example 4. The width and thickness of the coating film thus formed were measured by the same methods as those in Example 4. As a result, the line width of the coating film was 80.1 μm, and the sectional area of the coating film was 742 μm². The thickness of the coating film was 15.6 μm, and the aspect ratio of the cross-section of the coating film was 0.19 (=15.6 μm/80.1 μm). The value of (sectional area/line width) was 9.3 μm.

This coating film was used for producing a conductive film by the same method as that in Example 1. The resistance of the conductive film thus produced was measured by the same method as that in Example 1. As a result, the resistance of the conductive film was 0.902Ω, and the value of (resistance/sectional area) was 1.22 (mΩ/μm²) (=902 (mΩ)/742 (μm²)).

Example 6

The silver powder was surface-treated with amine by the same method as that in Example 4, except that 0.06 g of octylamine (FARMIN 08D produced by Kao Corporation) (0.05% by weight of octylamine with respect to the silver powder) was used in place of isobutylamine as the fatty amine.

With respect to the silver powder thus treated with amine, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}=1.2$ μm, $D_{50}=1.8$ μm, $D_{90}=2.9$ μm and $D_{max}=7.8$ μm. The BET specific surface area was 0.42 m²/g, and the tap density was 5.2 g/cm³.

The silver powder after treatment with amine was used for obtaining a conductive paste by the same method as that in Example 4, except that the amount of the silver powder was 89.6% by weight and that the amount of each of texanol and BCA was 3.4% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 1830 Pa·s at 0.1 rpm, 341 Pa·s at 1 rpm, 106 Pa·s at 5 rpm and 48 Pa·s at 10 rpm, respectively, at 25° C. The value Ti1 was 17, Ti2 was 38 and Ti3 was 3.2. The Casson viscosity η∞ was 9 Pa, and the Casson yield value τ0 was 404 Pa·s.

The conductive paste thus obtained was used for forming a coating film by the same method as that in Example 4. The width and thickness of the coating film thus formed were measured by the same methods as those in Example 4. As a result, the line width of the coating film was 72.4 μm, and the sectional area of the coating film was 707 μm². The thickness of the coating film was 17.6 μm, and the aspect ratio of the cross-section of the coating film was 0.24 (=17.6 μm/72.4 μm). The value of (sectional area/line width) was 9.8 μm.

This coating film was used for producing a conductive film by the same method as that in Example 1. The resistance of the conductive film thus produced was measured by the same method as that in Example 1. As a result, the resistance of the conductive film was 0.665Ω, and the value of (resistance/sectional area) was 0.941 (mΩ/μm²) (=665 (mΩ)/707 (μm²)).

Example 7

The silver powder was surface-treated with amine by the same method as that in Example 6, except that the amount of the octylamine solution to be added to the silver powder was 0.6 g (0.5% by weight of octylamine with respect to the silver powder).

With respect to the silver powder thus treated with amine, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}=1.2$ μm, $D_{50}=1.8$ μm, $D_{90}=2.8$ μm and $D_{max}=6.5$ μm. The BET specific surface area was 0.36 m²/g, and the tap density was 5.0 g/cm³.

The silver powder after treatment with amine was used for obtaining a conductive paste by the same method as that in Example 4, except that the amount of the silver powder was 91.0% by weight and that the amount of each of texanol and BCA was 2.7% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 2100 Pa·s at 0.1 rpm, 357 Pa·s at 1 rpm, 117 Pa·s at 5 rpm and 56 Pa·s at 10 rpm, respectively, at 25° C. The value Ti1 was 18, Ti2 was 38 and Ti3 was 3.1. The Casson viscosity η∞ was 11 Pa, and the Casson yield value τ0 was 435 Pa·s.

The conductive paste thus obtained was used for forming a coating film by the same method as that in Example 4. The width and thickness of the coating film thus formed were measured by the same methods as those in Example 4. As a result, the line width of the coating film was 74.3 μm, and the sectional area of the coating film was 690 μm². The thickness of the coating film was 17.5 μm, and the aspect ratio of the cross-section of the coating film was 0.24 (=17.5 μm/74.3 μm). The value of (sectional area/line width) was 9.3 μm.

This coating film was used for producing a conductive film by the same method as that in Example 1. The resistance of the conductive film thus produced was measured by the same method as that in Example 1. As a result, the resistance of the conductive film was 0.714Ω, and the value of (resistance/sectional area) was 1.03 (mΩ/μm²) (=714 (mΩ)/690 (m²)).

Example 8

The silver powder was surface-treated with amine by the same method as that in Example 4, except that 0.06 g of decylamine (produced by Wako Pure Chemical Industries, Ltd.) (0.05% by weight of decylamine with respect to the silver powder) was used in place of isobutylamine as the fatty amine.

With respect to the silver powder thus treated with amine, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}=1.2$ μm, $D_{50}=1.8$ μm, $D_{90}=2.8$ μm and $D_{max}=7.8$ μm. The BET specific surface area was 0.37 m²/g, and the tap density was 4.5 g/cm³.

The silver powder after treatment with amine was used for obtaining a conductive paste by the same method as that in Example 4, except that the amount of the silver powder was 90.0% by weight and that the amount of each of texanol and BCA was 3.2% by weight. The viscosity of the conductive paste thus obtained was measured by the same method as that in Example 1, and the Casson viscosity $\eta\infty$ and Casson yield value $\tau 0$ thereof were calculated by the same methods as those in Example 1. As a result, the viscosity was 1920 Pa·s at 0.1 rpm, 357 Pa·s at 1 rpm, 114 Pa·s at 5 rpm and 52 Pa·s at 10 rpm, respectively, at 25° C. The value Ti1 was 17, Ti2 was 37 and Ti3 was 3.1. The Casson viscosity $\eta\infty$ was 10 Pa, and the Casson yield value $\tau 0$ was 420 Pa·s.

The conductive paste thus obtained was used for forming a coating film by the same method as that in Example 4. The width and thickness of the coating film thus formed were measured by the same methods as those in Example 4. As a result, the line width of the coating film was 80.1 µm, and the sectional area of the coating film was 679 µm$^2$. The thickness of the coating film was 16.8 µm, and the aspect ratio of the cross-section of the coating film was 0.21 (=16.8 µm/80.1 µm). The value of (sectional area/line width) was 8.5 µm.

This coating film was used for producing a conductive film by the same method as that in Example 1. The resistance of the conductive film thus produced was measured by the same method as that in Example 1. As a result, the resistance of the conductive film was 0.635Ω, and the value of (resistance/sectional area) was 0.935 (mΩ/µm$^2$) (=635 (mΩ)/679 (µm$^2$)).

Example 9

The silver powder was surface-treated with amine by the same method as that in Example 8, except that the amount of the decylamine solution to be added to the silver powder was 0.6 g (0.5% by weight of octylamine with respect to the silver powder).

With respect to the silver powder thus treated with amine, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}$=1.2 µm, $D_{50}$=1.8 µm, $D_{90}$=2.8 µm and $D_{max}$=5.5 µm. The BET specific surface area was 0.36 m$^2$/g, and the tap density was 4.3 g/cm$^3$.

The silver powder after treatment with amine was used for obtaining a conductive paste by the same method as that in Example 4, except that the amount of the silver powder was 91.0% by weight and that the amount of each of texanol and BCA was 2.7% by weight. The viscosity of the conductive paste thus obtained was measured by the same method as that in Example 1, and the Casson viscosity $\eta\infty$ and Casson yield value $\tau 0$ thereof were calculated by the same methods as those in Example 1. As a result, the viscosity was 2300 Pa·s at 0.1 rpm, 389 Pa·s at 1 rpm, 120 Pa·s at 5 rpm and 57 Pa·s at 10 rpm, respectively, at 25° C. The value Ti1 was 19, Ti2 was 40 and Ti3 was 3.2. The Casson viscosity $\eta\infty$ was 10 Pa, and the Casson yield value $\tau 0$ was 486 Pa·s.

The conductive paste thus obtained was used for forming a coating film by the same method as that in Example 4. The width and thickness of the coating film thus formed were measured by the same methods as those in Example 4. As a result, the line width of the coating film was 76.2 µm, and the sectional area of the coating film was 732 µm$^2$. The thickness of the coating film was 17.8 µm, and the aspect ratio of the cross-section of the coating film was 0.23 (=17.8 µm/76.2 µm). The value of (sectional area/line width) was 9.6 µm.

This coating film was used for producing a conductive film by the same method as that in Example 1. The resistance of the conductive film thus produced was measured by the same method as that in Example 1. As a result, the resistance of the conductive film was 0.796Ω, and the value of (resistance/sectional area) was 1.09 (mΩ/µm$^2$) (=796 (mΩ)/732 (m$^2$)).

Example 10

The silver powder was surface-treated with amine by the same method as that in Example 4, except that 0.06 g of dodecylamine (produced by Wako Pure Chemical Industries, Ltd.) (0.05% by weight of dodecylamine with respect to the silver powder) was used in place of isobutylamine as the fatty amine.

With respect to the silver powder thus treated with amine, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}$=1.3 µm, $D_{50}$=1.9 µm, $D_{90}$=3.1 µm and $D_{max}$=11.0 µm. The BET specific surface area was 0.46 m$^2$/g, and the tap density was 4.6 g/cm$^3$.

The silver powder after treatment with amine was used for obtaining a conductive paste by the same method as that in Example 4, except that the amount of the silver powder was 89.8% by weight and that the amount of each of texanol and BCA was 3.3% by weight. The viscosity of the conductive paste thus obtained was measured by the same method as that in Example 1, and the Casson viscosity $\eta\infty$ and Casson yield value $\tau 0$ thereof were calculated by the same methods as those in Example 1. As a result, the viscosity was 1710 Pa·s at 0.1 rpm, 329 Pa·s at 1 rpm, 110 Pa·s at 5 rpm and 52 Pa·s at 10 rpm, respectively, at 25° C. The value Ti1 was 16, Ti2 was 33 and Ti3 was 3.0. The Casson viscosity $\eta\infty$ was 12 Pa, and the Casson yield value $\tau 0$ was 365 Pa·s.

The conductive paste thus obtained was used for forming a coating film by the same method as that in Example 4. The width and thickness of the coating film thus formed were measured by the same methods as those in Example 4. As a result, the line width of the coating film was 78.2 µm, and the sectional area of the coating film was 725 µm$^2$. The thickness of the coating film was 17.5 µm, and the aspect ratio of the cross-section of the coating film was 0.22 (=17.5 µm/78.2 µm). The value of (sectional area/line width) was 9.3 µm.

This coating film was used for producing a conductive film by the same method as that in Example 1. The resistance of the conductive film thus produced was measured by the same method as that in Example 1. As a result, the resistance of the conductive film was 0.695Ω, and the value of (resistance/sectional area) was 0.959 (mΩ/µm$^2$) (=695 (mΩ)/725 (µm$^2$)).

Example 11

The silver powder was surface-treated with amine by the same method as that in Example 10, except that the amount of the dodecylamine solution to be added to the silver powder was 0.6 g (0.5% by weight of dodecylamine with respect to the silver powder).

With respect to the silver powder thus treated with amine, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}=1.2$ μm, $D_{50}=1.8$ μm, $D_{90}=2.9$ μm and $D_{max}=6.5$ μm. The BET specific surface area was 0.35 m$^2$/g, and the tap density was 4.1 g/cm$^3$.

The silver powder after treatment with amine was used for obtaining a conductive paste by the same method as that in Example 4, except that the amount of the silver powder was 91.0% by weight and that the amount of each of texanol and BCA was 2.7% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 2220 Pa·s at 0.1 rpm, 389 Pa·s at 1 rpm, 117 Pa·s at 5 rpm and 50 Pa·s at 10 rpm, respectively, at 25° C. The value Ti1 was 19, Ti2 was 45 and Ti3 was 3.3. The Casson viscosity η∞ was 7 Pa, and the Casson yield value τ0 was 500 Pa·s.

The conductive paste thus obtained was used for forming a coating film by the same method as that in Example 4. The width and thickness of the coating film thus formed were measured by the same methods as those in Example 4. As a result, the line width of the coating film was 76.2 μm, and the sectional area of the coating film was 753 μm$^2$. The thickness of the coating film was 18.9 μm, and the aspect ratio of the cross-section of the coating film was 0.25 (=18.9 μm/76.2 μm). The value of (sectional area/line width) was 9.9 μm.

This coating film was used for producing a conductive film by the same method as that in Example 1. The resistance of the conductive film thus produced was measured by the same method as that in Example 1. As a result, the resistance of the conductive film was 0.618Ω, and the value of (resistance/sectional area) was 0.821 (mΩ/μm$^2$) (=618 (mΩ)/753 (μm$^2$)).

Example 12

The silver powder was surface-treated with amine by the same method as that in Example 4, except that 0.06 g of hexadecylamine (produced by Wako Pure Chemical Industries, Ltd.) (0.05% by weight of hexadecylamine with respect to the silver powder) was used in place of isobutylamine as the fatty amine.

With respect to the silver powder thus treated with amine, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}=1.1$ μm, $D_{50}=1.7$ μm, $D_{90}=2.9$ μm and $D_{max}=5.5$ μm. The BET specific surface area was 0.40 m$^2$/g, and the tap density was 5.4 g/cm$^3$.

The silver powder after treatment with amine was used for obtaining a conductive paste by the same method as that in Example 4, except that the amount of the silver powder was 89.8% by weight and that the amount of each of texanol and BCA was 3.3% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 1940 Pa·s at 0.1 rpm, 369 Pa·s at 1 rpm, 114 Pa·s at 5 rpm and 54 Pa·s at 10 rpm, respectively, at 25° C. The value Ti1 was 17, Ti2 was 36 and Ti3 was 3.2. The Casson viscosity η∞ was 11 Pa, and the Casson yield value τ0 was 425 Pa·s.

The conductive paste thus obtained was used for forming a coating film by the same method as that in Example 4. The width and thickness of the coating film thus formed were measured by the same methods as those in Example 4. As a result, the line width of the coating film was 76.2 μm, and the sectional area of the coating film was 743 μm$^2$. The thickness of the coating film was 18.3 μm, and the aspect ratio of the cross-section of the coating film was 0.24 (=18.3 μm/76.2 μm). The value of (sectional area/line width) was 9.7 μm.

This coating film was used for producing a conductive film by the same method as that in Example 1. The resistance of the conductive film thus produced was measured by the same method as that in Example 1. As a result, the resistance of the conductive film was 0.748Ω, and the value of (resistance/sectional area) was 1.01 (mΩ/μm$^2$) (=748 (mΩ)/743 (μm$^2$)).

Example 13

The silver powder was surface-treated with amine by the same method as that in Example 4, except that 0.6 g of hexadecylamine (produced by Wako Pure Chemical Industries, Ltd.) (0.5% by weight of hexadecylamine with respect to the silver powder) was used in place of isobutylamine as the fatty amine.

With respect to the silver powder thus treated with amine, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}=1.1$ μm, $D_{50}=1.8$ μm, $D_{90}=2.8$ μm and $D_{max}=6.5$ μm. The BET specific surface area was 0.36 m$^2$/g, and the tap density was 4.3 g/cm$^3$.

The silver powder after treatment with amine was used for obtaining a conductive paste by the same method as that in Example 4, except that the amount of the silver powder was 89.2% by weight and that the amount of each of texanol and BCA was 3.6% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 2380 Pa·s at 0.1 rpm, 345 Pa·s at 1 rpm, 100 Pa·s at 5 rpm and 48 Pa·s at 10 rpm, respectively, at 25° C. The value Ti1 was 24, Ti2 was 50 and Ti3 was 3.5. The Casson viscosity η∞ was 6 Pa, and the Casson yield value τ0 was 488 Pa·s.

The conductive paste thus obtained was used for forming a coating film by the same method as that in Example 4. The width and thickness of the coating film thus formed were measured by the same methods as those in Example 4. As a result, the line width of the coating film was 70.5 μm, and the sectional area of the coating film was 858 μm$^2$. The thickness of the coating film was 22.0 μm, and the aspect ratio of the cross-section of the coating film was 0.31 (=22.0 μm/70.5 μm). The value of (sectional area/line width) was 12.2 μm.

This coating film was used for producing a conductive film by the same method as that in Example 1. The resistance of the conductive film thus produced was measured by the same method as that in Example 1. As a result, the resistance of the conductive film was 0.795Ω, and the value of (resistance/sectional area) was 0.927 (mΩ/μm$^2$) (=795 (mΩ)/858 (m$^2$)).

Example 14

The silver powder was surface-treated with amine by the same method as that in Example 4, except that 0.06 g of octadecylamine (produced by Wako Pure Chemical Industries, Ltd.) (0.05% by weight of octadecylamine with respect to the silver powder) was used in place of isobutylamine as the fatty amine.

With respect to the silver powder thus treated with amine, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}$=1.2 μm, $D_{50}$=1.8 μm, $D_{90}$=2.7 μm and $D_{max}$=6.5 μm. The BET specific surface area was 0.42 m$^2$/g, and the tap density was 5.8 g/cm$^3$.

The silver powder after treatment with amine was used for obtaining a conductive paste by the same method as that in Example 4, except that the amount of the silver powder was 89.2% by weight and that the amount of each of texanol and BCA was 3.6% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 1870 Pa·s at 0.1 rpm, 333 Pa·s at 1 rpm, 106 Pa·s at 5 rpm and 50 Pa·s at 10 rpm, respectively, at 25° C. The value Ti1 was 18, Ti2 was 37 and Ti3 was 3.1. The Casson viscosity η∞ was 10 Pa, and the Casson yield value τ0 was 398 Pa·s.

The conductive paste thus obtained was used for forming a coating film by the same method as that in Example 4. The width and thickness of the coating film thus formed were measured by the same methods as those in Example 4. As a result, the line width of the coating film was 76.2 μm, and the sectional area of the coating film was 670 μm$^2$. The thickness of the coating film was 17.5 μm, and the aspect ratio of the cross-section of the coating film was 0.23 (=17.5 μm/76.2 μm). The value of (sectional area/line width) was 8.8 μm.

This coating film was used for producing a conductive film by the same method as that in Example 1. The resistance of the conductive film thus produced was measured by the same method as that in Example 1. As a result, the resistance of the conductive film was 0.649Ω, and the value of (resistance/sectional area) was 0.969 (mΩ/μm$^2$) (=649 (mΩ)/670 (μm$^2$)).

Example 15

The silver powder was surface-treated with amine by the same method as that in Example 14, except that the amount of the octadecylamine solution to be added to the silver powder was 0.6 g (0.5% by weight of octadecylamine with respect to the silver powder).

With respect to the silver powder thus treated with amine, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}$=1.3 μm, $D_{50}$=2.0 μm, $D_{90}$=3.2 μm and $D_{max}$=7.8 μm. The BET specific surface area was 0.40 m$^2$/g, and the tap density was 4.4 g/cm$^3$.

The silver powder after treatment with amine was used for obtaining a conductive paste by the same method as that in Example 4, except that the amount of the silver powder was 90.6% by weight and that the amount of each of texanol and BCA was 2.9% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 2740 Pa·s at 0.1 rpm, 381 Pa·s at 1 rpm, 114 Pa·s at 5 rpm and 50 Pa·s at 10 rpm, respectively, at 25° C. The value Ti1 was 24, Ti2 was 55 and Ti3 was 3.3. The Casson viscosity η∞ was 5 Pa, and the Casson yield value τ0 was 570 Pa·s.

The conductive paste thus obtained was used for forming a coating film by the same method as that in Example 4. The width and thickness of the coating film thus formed were measured by the same methods as those in Example 4. As a result, the line width of the coating film was 64.8 μm, and the sectional area of the coating film was 732 μm$^2$. The thickness of the coating film was 19.6 μm, and the aspect ratio of the cross-section of the coating film was 0.30 (=19.6 μm/64.8 μm). The value of (sectional area/line width) was 11.3 μm.

This coating film was used for producing a conductive film by the same method as that in Example 1. The resistance of the conductive film thus produced was measured by the same method as that in Example 1. As a result, the resistance of the conductive film was 0.697Ω, and the value of (resistance/sectional area) was 0.952 (mΩ/μm$^2$) (=697 (mΩ)/732 (μm$^2$)).

Example 16

The silver powder was surface-treated with amine by the same method as that in Example 4, except that 0.06 g of oleylamine (produced by Wako Pure Chemical Industries, Ltd.) (0.05% of oleylamine with respect to the silver powder) was used in place of isobutylamine as the fatty amine.

With respect to the silver powder thus treated with amine, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}$=1.1 μm, $D_{50}$=1.8 μm $D_{90}$=2.9 μm and $D_{max}$=5.5 μm. The BET specific surface area was 0.39 m$^2$/g, and the tap density was 5.2 g/cm$^3$.

The silver powder after treatment with amine was used for obtaining a conductive paste by the same method as that in Example 4, except that the amount of the silver powder was 91.0% by weight and that the amount of each of texanol and BCA was 2.7% by weight. The viscosity of the conductive paste thus obtained was measured by the same method as that in Example 1, and the Casson viscosity $\eta\infty$ and Casson yield value $\tau 0$ thereof were calculated by the same methods as those in Example 1. As a result, the viscosity was 2060 Pa·s at 0.1 rpm, 381 Pa·s at 1 rpm, 121 Pa·s at 5 rpm and 50 Pa·s at 10 rpm, respectively, at 25° C. The value Ti1 was 17, Ti2 was 41 and Ti3 was 3.1. The Casson viscosity $\eta\infty$ was 9 Pa, and the Casson yield value $\tau 0$ was 467 Pa·s.

The conductive paste thus obtained was used for forming a coating film by the same method as that in Example 4. The width and thickness of the coating film thus formed were measured by the same methods as those in Example 4. As a result, the line width of the coating film was 74.3 µm, and the sectional area of the coating film was 674 µm². The thickness of the coating film was 16.9 µm, and the aspect ratio of the cross-section of the coating film was 0.23 (=16.9 µm/74.3 µm). The value of (sectional area/line width) was 9.1 µm.

This coating film was used for producing a conductive film by the same method as that in Example 1. The resistance of the conductive film thus produced was measured by the same method as that in Example 1. As a result, the resistance of the conductive film was 0.668$\Omega$, and the value of (resistance/sectional area) was 0.991 (m$\Omega$/µm²) (=668 (m$\Omega$)/674 (µm²)).

Example 17

The silver powder was surface-treated with amine by the same method as that in Example 16, except that the amount of the oleylamine solution to be added to the silver powder was 0.6 g (0.5% by weight of oleylamine with respect to the silver powder).

With respect to the silver powder thus treated with amine, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}=1.1$ µm, $D_{50}=1.8$ µm, $D_{90}=2.8$ µm and $D_{max}=6.5$ µm. The BET specific surface area was 0.25 m²/g, and the tap density was 4.3 g/cm³.

Then, 13 mg of the silver powder after treatment with amine was heated at 460° C. by means of a pyrolyzer (EGA/PY3030D produced by Frontier Laboratories Ltd.), and the component analysis thereof was carried out by means of a gas chromatography mass spectrometer (GC-MS) (7890A/5975C produced by Agilent Technologies Co., Ltd.). As a result, there was confirmed peaks derived from palmitic acid (molecular weight 256), stearic acid (molecular weight 284), oleylamine (molecular weight 267), oleonitrile (molecular weight 263) and a component having a molecular weight of 533 as shown in FIG. 1. It is guessed that the peak of the component having the molecular weight of 533 is a peak obtained by removing water molecule (molecular weight 18) from a product obtained by the condensation reaction of stearic acid with oleylamine, so that it is found that an amide is formed by stearic acid and oleylamine. Furthermore, it is considered that palmitic acid is an impurity derived from a chemical reagent of stearic acid and that oleonitrile is an impurity derived from a chemical reagent of oleylamine.

The silver powder after treatment with amine was used for obtaining a conductive paste by the same method as that in Example 4, except that the amount of the silver powder was 90.2% by weight and that the amount of each of texanol and BCA was 3.1% by weight. The viscosity of the conductive paste thus obtained was measured by the same method as that in Example 1, and the Casson viscosity $\eta\infty$ and Casson yield value $\tau 0$ thereof were calculated by the same methods as those in Example 1. As a result, the viscosity was 2340 Pa·s at 0.1 rpm, 377 Pa·s at 1 rpm, 110 Pa·s at 5 rpm and 47 Pa·s at 10 rpm, respectively, at 25° C. The value Ti1 was 21, Ti2 was 50 and Ti3 was 3.4. The Casson viscosity $\eta\infty$ was 5 Pa, and the Casson yield value $\tau 0$ was 515 Pa·s.

The conductive paste thus obtained was used for forming a coating film by the same method as that in Example 4. The width and thickness of the coating film thus formed were measured by the same methods as those in Example 4. As a result, the line width of the coating film was 70.5 µm, and the sectional area of the coating film was 800 µm². The thickness of the coating film was 22.4 µm, and the aspect ratio of the cross-section of the coating film was 0.32 (=22.4 µm/70.5 µm). The value of (sectional area/line width) was 11.3 µm.

This coating film was used for producing a conductive film by the same method as that in Example 1. The resistance of the conductive film thus produced was measured by the same method as that in Example 1. As a result, the resistance of the conductive film was 0.722$\Omega$, and the value of (resistance/sectional area) was 0.903 (m$\Omega$/µm²) (=722 (m$\Omega$)/800 (µm²)).

Example 18

The silver powder was surface-treated with amine by the same method as that in Example 4, except that 0.06 g of 2-ethylhexyloxypropylamine (2EHOPA) (produced by Koei Chemical Industry Co., Ltd.) (0.05% by weight of 2-ethylhexyloxypropylamine with respect to the silver powder) was used in place of isobutylamine as the fatty amine.

With respect to the silver powder thus treated with amine, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}=1.2$ µm, $D_{50}=1.8$ µm, $D_{90}=2.8$ µm and $D_{max}=6.5$ µm. The BET specific surface area was 0.36 m²/g, and the tap density was 6.1 g/cm³.

The silver powder after treatment with amine was used for obtaining a conductive paste by the same method as that in Example 4, except that the amount of the silver powder was 89.6% by weight and that the amount of each of texanol and BCA was 3.4% by weight. The viscosity of the conductive paste thus obtained was measured by the same method as that in Example 1, and the Casson viscosity $\eta\infty$ and Casson yield value $\tau 0$ thereof were calculated by the same methods as those in Example 1. As a result, the viscosity was 2260 Pa·s at 0.1 rpm, 393 Pa·s at 1 rpm, 112 Pa·s at 5 rpm and 56 Pa·s at 10 rpm, respectively, at 25° C. The value Ti1 was 20, Ti2 was 41 and Ti3 was 3.5. The Casson viscosity $\eta\infty$ was 9 Pa, and the Casson yield value $\tau 0$ was 485 Pa·s.

The conductive paste thus obtained was used for forming a coating film by the same method as that in Example 4. The width and thickness of the coating film thus formed were measured by the same methods as those in Example 4. As a result, the line width of the coating film was 76.2 μm, and the sectional area of the coating film was 711 μm². The thickness of the coating film was 16.9 μm, and the aspect ratio of the cross-section of the coating film was 0.22 (=16.9 μm/76.2 μm). The value of (sectional area/line width) was 9.3 μm.

This coating film was used for producing a conductive film by the same method as that in Example 1. The resistance of the conductive film thus produced was measured by the same method as that in Example 1. As a result, the resistance of the conductive film was 0.766Ω, and the value of (resistance/sectional area) was 1.08 (mΩ/μm²) (=766 (mΩ)/711 (m²)).

Example 19

The silver powder was surface-treated with amine by the same method as that in Example 18, except that the amount of 2-ethylhexyloxypropylamine (2EHOPA) to be added to the silver powder was 0.6 g (0.5% by weight of 2-ethylhexyloxypropylamine with respect to the silver powder).

With respect to the silver powder thus treated with amine, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}$=1.2 μm, $D_{50}$=1.8 μm, $D_{90}$=2.9 μm and $D_{max}$=6.5 μm. The BET specific surface area was 0.27 m²/g, and the tap density was 4.3 g/cm³.

The silver powder after treatment with amine was used for obtaining a conductive paste by the same method as that in Example 4, except that the amount of the silver powder was 90.2% by weight and that the amount of each of texanol and BCA was 3.1% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 1670 Pa·s at 0.1 rpm, 306 Pa·s at 1 rpm, 96 Pa·s at 5 rpm and 46 Pa·s at 10 rpm, respectively, at 25° C. The value Ti1 was 17, Ti2 was 37 and Ti3 was 3.2. The Casson viscosity η∞ was 9 Pa, and the Casson yield value τ0 was 359 Pa·s.

The conductive paste thus obtained was used for forming a coating film by the same method as that in Example 4. The width and thickness of the coating film thus formed were measured by the same methods as those in Example 4. As a result, the line width of the coating film was 70.5 μm, and the sectional area of the coating film was 806 μm². The thickness of the coating film was 20.1 μm, and the aspect ratio of the cross-section of the coating film was 0.29 (=20.1 μm/70.5 μm). The value of (sectional area/line width) was 11.4 μm.

This coating film was used for producing a conductive film by the same method as that in Example 1. The resistance of the conductive film thus produced was measured by the same method as that in Example 1. As a result, the resistance of the conductive film was 0.759Ω, and the value of (resistance/sectional area) was 0.942 (mΩ/μm²) (=759 (mΩ)/806 (μm²)).

Example 20

The silver powder was surface-treated with amine by the same method as that in Example 4, except that 0.06 g of 3-lauryloxypropylamine (produced by Koei Chemical Industry Co., Ltd.) (0.5% by weight of 3-lauryloxypropylamine with respect to the silver powder) was used in place of isobutylamine as the fatty amine.

With respect to the silver powder thus treated with amine, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}$=1.3 μm, $D_{50}$=2.0 μm, $D_{90}$=3.0 μm and $D_{max}$=6.5 μm. The BET specific surface area was 0.34 m²/g, and the tap density was 4.8 g/cm³.

The silver powder after treatment with amine was used for obtaining a conductive paste by the same method as that in Example 4, except that the amount of the silver powder was 90.4% by weight and that the amount of each of texanol and BCA was 3.0% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 1720 Pa·s at 0.1 rpm, 294 Pa·s at 1 rpm, 94 Pa·s at 5 rpm and 51 Pa·s at 10 rpm, respectively, at 25 The value Ti1 was 18, Ti2 was 34 and Ti3 was 3.1. The Casson viscosity η∞ was 11 Pa, and the Casson yield value τ0 was 340 Pa·s.

The conductive paste thus obtained was used for forming a coating film by the same method as that in Example 4. The width and thickness of the coating film thus formed were measured by the same methods as those in Example 4. As a result, the line width of the coating film was 82.0 μm, and the sectional area of the coating film was 693 μm². The thickness of the coating film was 17.3 μm, and the aspect ratio of the cross-section of the coating film was 0.21 (=17.3 μm/82.0 μm). The value of (sectional area/line width) was 8.4 μm.

This coating film was used for producing a conductive film by the same method as that in Example 1. The resistance of the conductive film thus produced was measured by the same method as that in Example 1. As a result, the resistance of the conductive film was 0.773Ω, and the value of (resistance/sectional area) was 1.12 (mΩ/μm²) (=773 (mΩ)/693 (μm²)).

Comparative Example 6

With respect to the same silver powder as that in Example 1 (the silver powder before treatment with amine), the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}$=1.2 μm, $D_{50}$=1.9 μm, $D_{90}$=3.1 μm and $D_{max}$=6.5 μm. The BET specific surface area was 0.40 m²/g, and the tap density was 6.5 g/cm³.

The above-described silver powder was used for obtaining a conductive paste by the same method as that in Example 4, except that the amount of the silver powder was 88.8% by weight and that the amount of each of texanol and BCA was 3.8% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 1510 Pa·s at 0.1 rpm, 357 Pa·s at 1 rpm, 110 Pa·s at 5 rpm and 59 Pa·s at 10 rpm, respectively, at 25 The value Ti1 was 14, Ti2 was 26 and Ti3 was 3.2. The Casson viscosity η∞ was 16 Pa, and the Casson yield value τ0 was 335 Pa·s.

The conductive paste thus obtained was used for forming a coating film by the same method as that in Example 4. The width and thickness of the coating film thus formed were measured by the same methods as those in Example 4. As a result, the line width of the coating film was 85.8 μm, and the sectional area of the coating film was 700 μm². The thickness of the coating film was 14.8 μm, and the aspect ratio of the cross-section of the coating film was 0.17 (=14.8 μm/85.8 μm). The value of (sectional area/line width) was 8.2 μm.

This coating film was used for producing a conductive film by the same method as that in Example 1. The resistance of the conductive film thus produced was measured by the same method as that in Example 1. As a result, the resistance of the conductive film was 1.009Ω, and the value of (resistance/sectional area) was 1.44 (mΩ/μm²) (=1009 (mΩ)/700 (μm²)).

Comparative Example 7

A silver powder surface-treated was produced by the same method as that in Example 4, except that there was prepared a stearic amide solution which was obtained by heating 3.8 g of stearic acid (produced by Wako Pure Chemical Industries, Ltd.) and 5.0 g of oleylamine at 60° C. for 60 minutes by means of a hot air type thermostat chamber and that 0.6 g of this stearic amide solution (0.5% by weight of stearic amide with respect to the silver powder) was substituted for the hexadecylamine solution.

With respect to the silver powder thus treated with amide, the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}$=1.2 μm, $D_{50}$=1.8 μm, $D_{90}$=3.2 μm and $D_{max}$=6.5 μm. The BET specific surface area was 0.29 m²/g, and the tap density was 3.6 g/cm³.

The silver powder after treatment with amide was used for obtaining a conductive paste by the same method as that in Example 4, except that the amount of the silver powder was 89.2% by weight and that the amount of each of texanol and BCA was 3.6% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 1670 Pa·s at 0.1 rpm, 306 Pa·s at 1 rpm, 106 Pa·s at 5 rpm and 54 Pa·s at 10 rpm, respectively, at 25° C. The value Ti1 was 16, Ti2 was 31 and Ti3 was 2.9. The Casson viscosity η∞ was 14 Pa, and the Casson yield value τ0 was 336 Pa·s.

The conductive paste thus obtained was used for forming a coating film by the same method as that in Example 4. The width and thickness of the coating film thus formed were measured by the same methods as those in Example 4. As a result, the line width of the coating film was 76.2 μm, and the sectional area of the coating film was 658 μm². The thickness of the coating film was 15.2 μm, and the aspect ratio of the cross-section of the coating film was 0.20 (=15.2 μm/76.2 μm). The value of (sectional area/line width) was 8.6 μm.

This coating film was used for producing a conductive film by the same method as that in Example 1. The resistance of the conductive film thus produced was measured by the same method as that in Example 1. As a result, the resistance of the conductive film was 1.138Ω, and the value of (resistance/sectional area) was 1.73 (mΩ/μm²) (=1138 (mΩ)/658 (μm²)).

The results in Examples 4-20 and Comparative Example 6-7 are shown in Tables 6-8.

TABLE 6

| | Dispersing Agent | Surface Treatment Agent Kind | Amount (wt %) | Particle Size after Surface Treatment (μm) | | | | BET (m²/g) | TAP (g/cm³) |
| --- | --- | --- | --- | --- | --- | --- | --- | --- | --- |
| | | | | $D_{10}$ | $D_{50}$ | $D_{90}$ | $D_{max}$ | | |
| Ex. 4 | Stearic acid | IBA | 0.05 | 1.2 | 1.8 | 2.9 | 6.5 | 0.41 | 5.6 |
| Ex. 5 | | | 0.5 | 1.1 | 1.8 | 2.8 | 6.5 | 0.40 | 6.0 |
| Ex. 6 | | OCA | 0.05 | 1.2 | 1.8 | 2.9 | 7.8 | 0.42 | 5.2 |
| Ex. 7 | | | 0.5 | 1.2 | 1.8 | 2.8 | 6.5 | 0.36 | 5.0 |
| Ex. 8 | | DA | 0.05 | 1.2 | 1.8 | 2.8 | 7.8 | 0.37 | 4.5 |
| Ex. 9 | | | 0.5 | 1.2 | 1.8 | 2.8 | 5.5 | 0.36 | 4.3 |
| Ex. 10 | | DDA | 0.05 | 1.3 | 1.9 | 3.1 | 11.0 | 0.46 | 4.6 |
| Ex. 11 | | | 0.5 | 1.2 | 1.8 | 2.9 | 6.5 | 0.35 | 4.1 |
| Ex. 12 | | HDA | 0.05 | 1.1 | 1.7 | 2.9 | 5.5 | 0.40 | 5.4 |
| Ex. 13 | | | 0.5 | 1.1 | 1.8 | 2.8 | 6.5 | 0.36 | 4.3 |
| Ex. 14 | | ODA | 0.05 | 1.2 | 1.8 | 2.7 | 6.5 | 0.42 | 5.8 |
| Ex. 15 | | | 0.5 | 1.3 | 2.0 | 3.2 | 7.8 | 0.40 | 4.4 |
| Ex. 16 | | OLA | 0.05 | 1.1 | 1.8 | 2.9 | 5.5 | 0.39 | 5.2 |
| Ex. 17 | | | 0.5 | 1.1 | 1.8 | 2.8 | 6.5 | 0.25 | 4.3 |
| Ex. 18 | | 2EHOPA | 0.05 | 1.2 | 1.8 | 2.8 | 6.5 | 0.36 | 6.1 |
| Ex. 19 | | | 0.5 | 1.2 | 1.8 | 2.9 | 6.5 | 0.27 | 4.3 |
| Ex. 20 | | 3LOPA | 0.5 | 1.3 | 2.0 | 3.0 | 6.5 | 0.34 | 4.8 |

TABLE 6-continued

| | Dispersing Agent | Surface Treatment Agent Kind | Amount (wt %) | Particle Size after Surface Treatment (μm) $D_{10}$ | $D_{50}$ | $D_{90}$ | $D_{max}$ | BET ($m^2/g$) | TAP ($g/cm^3$) |
|---|---|---|---|---|---|---|---|---|---|
| Comp. 6 | — | — | — | 1.2 | 1.9 | 3.1 | 6.5 | 0.40 | 6.5 |
| Comp. 7 | | amide (stearic acid + OLA | 0.5 | 1.2 | 1.8 | 3.2 | 6.5 | 0.29 | 3.8 |

IBA: isobutylamine,
OCA: octylamine,
DA: decylamine,
DDA: dodecylamine,
HAD: hexadecylamine,
ODA: octadecylamine,
OLA: oleylamine,
2EHOPA: 2-ethylhexyloxypropylamine,
3LOPA: 3-lauryloxypropylamine

TABLE 7

| | Viscosity (Pa·s) | | | | | | | Casson Viscosity (Pa) | Casson Yield Value (Pa·s) |
|---|---|---|---|---|---|---|---|---|---|
| | 0.1 rpm | 1 rpm | 5 rpm | 10 rpm | Ti1 | Ti2 | Ti3 | | |
| Ex. 4 | 2020 | 369 | 122 | 58 | 17 | 35 | 3.0 | 12 | 427 |
| Ex. 5 | 1720 | 310 | 94 | 53 | 18 | 32 | 3.3 | 12 | 346 |
| Ex. 6 | 1830 | 341 | 106 | 48 | 17 | 38 | 3.2 | 9 | 404 |
| Ex. 7 | 2100 | 357 | 117 | 56 | 18 | 38 | 3.1 | 11 | 435 |
| Ex. 8 | 1920 | 357 | 114 | 52 | 17 | 37 | 3.1 | 10 | 420 |
| Ex. 9 | 2300 | 389 | 120 | 57 | 19 | 40 | 3.2 | 10 | 486 |
| Ex. 10 | 1710 | 329 | 110 | 52 | 16 | 33 | 3.0 | 12 | 365 |
| Ex. 11 | 2220 | 389 | 117 | 50 | 19 | 45 | 3.3 | 7 | 500 |
| Ex. 12 | 1940 | 369 | 114 | 54 | 17 | 36 | 3.2 | 11 | 425 |
| Ex. 13 | 2380 | 345 | 100 | 48 | 24 | 50 | 3.5 | 6 | 488 |
| Ex. 14 | 1870 | 333 | 106 | 50 | 18 | 37 | 3.1 | 10 | 398 |
| Ex. 15 | 2740 | 381 | 114 | 50 | 24 | 55 | 3.3 | 5 | 570 |
| Ex. 16 | 2060 | 381 | 121 | 50 | 17 | 41 | 3.1 | 9 | 467 |
| Ex. 17 | 2340 | 377 | 110 | 47 | 21 | 50 | 3.4 | 5 | 515 |
| Ex. 18 | 2260 | 393 | 112 | 56 | 20 | 41 | 3.5 | 9 | 485 |
| Ex. 19 | 1670 | 306 | 96 | 46 | 17 | 37 | 3.2 | 9 | 359 |
| Ex. 20 | 1720 | 294 | 94 | 51 | 18 | 34 | 3.1 | 11 | 340 |
| Comp. 6 | 1510 | 357 | 110 | 59 | 14 | 26 | 3.2 | 16 | 335 |
| Comp. 7 | 1670 | 306 | 106 | 54 | 16 | 31 | 2.9 | 14 | 336 |

TABLE 8

| | Line Width (μm) | Thickness (μm) | Aspect Ratio | Sectional Area ($μm^2$) | Sectional Area/Line Width (μm) | Resistance (Ω) | Resistance/Sectional Area ($mΩ/μm^2$) |
|---|---|---|---|---|---|---|---|
| Ex. 4 | 85.8 | 16.1 | 0.19 | 780 | 9.1 | 0.826 | 1.06 |
| Ex. 5 | 80.1 | 15.6 | 0.19 | 742 | 9.3 | 0.902 | 1.22 |
| Ex. 6 | 72.4 | 17.6 | 0.24 | 707 | 9.8 | 0.665 | 0.941 |
| Ex. 7 | 74.3 | 17.5 | 0.24 | 690 | 9.3 | 0.714 | 1.03 |
| Ex. 8 | 80.1 | 16.8 | 0.21 | 679 | 8.5 | 0.635 | 0.935 |
| Ex. 9 | 76.2 | 17.8 | 0.23 | 732 | 9.6 | 0.796 | 1.09 |
| Ex. 10 | 78.2 | 17.5 | 0.22 | 725 | 9.3 | 0.695 | 0.959 |
| Ex. 11 | 76.2 | 18.9 | 0.25 | 753 | 9.9 | 0.618 | 0.821 |
| Ex. 12 | 76.2 | 18.3 | 0.24 | 743 | 9.7 | 0.748 | 1.01 |
| Ex. 13 | 70.5 | 22.0 | 0.31 | 858 | 12.2 | 0.795 | 0.927 |
| Ex. 14 | 76.2 | 17.5 | 0.23 | 670 | 8.8 | 0.649 | 0.969 |
| Ex. 15 | 64.8 | 19.6 | 0.30 | 732 | 11.3 | 0.697 | 0.952 |
| Ex. 16 | 74.3 | 16.9 | 0.23 | 674 | 9.1 | 0.668 | 0.991 |
| Ex. 17 | 70.5 | 22.4 | 0.32 | 800 | 11.3 | 0.722 | 0.903 |
| Ex. 18 | 76.2 | 16.9 | 0.22 | 711 | 9.3 | 0.766 | 1.08 |
| Ex. 19 | 70.5 | 20.1 | 0.29 | 806 | 11.4 | 0.759 | 0.942 |
| Ex. 20 | 82.0 | 17.3 | 0.21 | 693 | 8.4 | 0.773 | 1.12 |
| Comp. 6 | 85.8 | 14.8 | 0.17 | 700 | 8.2 | 1.009 | 1.44 |
| Comp. 7 | 76.2 | 15.2 | 0.20 | 658 | 8.6 | 1.138 | 1.73 |

Example 21

First, 45 L of industrial ammonia water was added to 502.7 L of a silver nitrate solution containing 21.4 g/L of silver ions to form a silver ammine complex solution. The pH of the formed silver ammine complex solution was adjusted by adding 8.8 L of a solution containing 100 g/L of sodium hydroxide thereto. This solution was distilled by adding 462 L of water thereto, and 48 L of industrial formalin serving as a reducing agent was added thereto. Immediately thereafter, 19.4 g of oleic acid was added thereto. After a silver slurry thus obtained was filtered and washed with water, it was dried to obtain a silver powder. After the surface smoothing treatment of this silver powder was carried out by means of a Henschel mixer (high-speed mixer), the classification thereof was carried out to remove large aggregates of silver being larger than 11 µm.

With respect to the substantially spherical silver powder thus obtained, the particle size distribution and the BET specific surface area were measured by the same methods as those in Example 1, and the tap density was calculated by the same method as that in Example 1. As a result, the particle size distribution was $D_{10}$=1.2 µm, $D_{50}$=2.3 µm and $D_{90}$=3.5 µm. The BET specific surface area was 0.41 m$^2$/g, and the tap density was 5.0 g/cm$^3$.

The silver powder thus obtained was used to be surface-treated by the same method as that in Example 5.

With respect to the silver powder thus treated with amine, the particle size distribution based on the laser diffraction method and the BET specific surface area were measured by the same methods as those for the silver powder before treatment with amine in Example 1, and the tap density was calculated by the same method as that for the silver powder before treatment with amine in Example 1. As a result, the particle size distribution was $D_{10}$=1.1 µm, $D_{50}$=2.0 µm, $D_{90}$=3.3 µm and $D_{max}$=9.3 µm. The BET specific surface area was 0.37 m$^2$/g, and the tap density was 5.0 g/cm$^3$.

The silver powder after treatment with amine was used for obtaining a conductive paste by the same method as that in Example 4, except that the amount of the silver powder was 90.4% by weight and that the amount of each of texanol and BCA was 3.0% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 2460 Pa·s at 0.1 rpm, 401 Pa·s at 1 rpm, 129 Pa·s at 5 rpm and 55 Pa·s at 10 rpm, respectively, at 25° C. The value Ti1 was 19, Ti2 was 45 and Ti3 was 3.1. The Casson viscosity η∞ was 8.5 Pa, and the Casson yield value τ0 was 529 Pa·s.

The conductive paste thus obtained was used for forming a coating film by the same method as that in Example 4. The width and thickness of the coating film thus formed were measured by the same methods as those in Example 4. As a result, the line width of the coating film was 62.9 µm, and the sectional area of the coating film was 662 µm$^2$. The thickness of the coating film was 17.5 µm, and the aspect ratio of the cross-section of the coating film was 0.28 (=17.5 µm/62.9 µm). The value of (sectional area/line width) was 10.5 µm.

This coating film was used for producing a conductive film by the same method as that in Example 1. The resistance of the conductive film thus produced was measured by the same method as that in Example 1. As a result, the resistance of the conductive film was 0.754Ω, and the value of (resistance/sectional area) was 1.14 (mΩ/µm$^2$) (=754 (mΩ)/662 (µm$^2$)).

Example 22

The same silver powder (the silver powder before treatment with amine) as that in Example 21 was used to be surface-treated with amine by the same method as that in Example 7.

With respect to the silver powder thus treated with amine, the particle size distribution based on the laser diffraction method and the BET specific surface area were measured by the same methods as those for the silver powder before treatment with amine in Example 1, and the tap density was calculated by the same method as that for the silver powder before treatment with amine in Example 1. As a result, the particle size distribution was $D_{10}$=1.2 µm, $D_{50}$=2.3 µm, $D_{90}$=3.8 µm and $D_{max}$=9.3 µm. The BET specific surface area was 0.35 m$^2$/g, and the tap density was 4.3 g/cm$^3$.

The silver powder after treatment with amine was used for obtaining a conductive paste by the same method as that in Example 4, except that the amount of the silver powder was 90.6% by weight and that the amount of each of texanol and BCA was 2.9% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 2200 Pa·s at 0.1 rpm, 314 Pa·s at 1 rpm, 108 Pa·s at 5 rpm and 51 Pa·s at 10 rpm, respectively, at 25° C. The value Ti1 was 17, Ti2 was 38 and Ti3 was 2.9. The Casson viscosity η∞ was 8.7 Pa, and the Casson yield value τ0 was 429 Pa·s.

The conductive paste thus obtained was used for forming a coating film by the same method as that in Example 4. The width and thickness of the coating film thus formed were measured by the same methods as those in Example 4. As a result, the line width of the coating film was 64.3 µm, and the sectional area of the coating film was 721 µm$^2$. The thickness of the coating film was 22.3 µm, and the aspect ratio of the cross-section of the coating film was 0.35 (=22.3 µm/64.3 µm). The value of (sectional area/line width) was 11.2 µm.

This coating film was used for producing a conductive film by the same method as that in Example 1. The resistance of the conductive film thus produced was measured by the same method as that in Example 1. As a result, the resistance of the conductive film was 0.662Ω, and the value of (resistance/sectional area) was 0.918 (mΩ/µm$^2$) (=662 (mΩ)/721 (µm$^2$)).

Example 23

The same silver powder (the silver powder before treatment with amine) as that in Example 21 was used to be surface-treated with amine by the same method as that in Example 9.

With respect to the silver powder thus treated with amine, the particle size distribution based on the laser diffraction method and the BET specific surface area were measured by the same methods as those for the silver powder before treatment with amine in Example 1, and the tap density was calculated by the same method as that for the silver powder before treatment with amine in Example 1. As a result, the particle size distribution was $D_{10}$=1.1 µm, $D_{50}$=2.1 µm, $D_{90}$=3.8 µm and $D_{max}$=7.8 µm. The BET specific surface area was 0.36 m$^2$/g, and the tap density was 4.2 g/cm$^3$.

The silver powder after treatment with amine was used for obtaining a conductive paste by the same method as that in Example 4, except that the amount of the silver powder was 90.6% by weight and that the amount of each of texanol and BCA was 2.9% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 2420 Pa·s at 0.1 rpm, 413 Pa·s at 1 rpm, 121 Pa·s at 5 rpm and 65 Pa·s at 10 rpm, respectively, at 25° C. The value Ti1 was 20, Ti2 was 37 and Ti3 was 3.4. The Casson viscosity η∞ was 11.8 Pa, and the Casson yield value τ0 was 495 Pa·s.

The conductive paste thus obtained was used for forming a coating film by the same method as that in Example 4. The width and thickness of the coating film thus formed were measured by the same methods as those in Example 4. As a result, the line width of the coating film was 64.8 μm, and the sectional area of the coating film was 715 μm$^2$. The thickness of the coating film was 21.0 μm, and the aspect ratio of the cross-section of the coating film was 0.32 (=21.0 μm/64.8 μm). The value of (sectional area/line width) was 11.0 μm.

This coating film was used for producing a conductive film by the same method as that in Example 1. The resistance of the conductive film thus produced was measured by the same method as that in Example 1. As a result, the resistance of the conductive film was 0.756Ω, and the value of (resistance/sectional area) was 1.06 (mΩ/μm$^2$) (=756 (mΩ)/715 (m$^2$)).

Example 24

The same silver powder (the silver powder before treatment with amine) as that in Example 21 was used to be surface-treated with amine by the same method as that in Example 11.

With respect to the silver powder thus treated with amine, the particle size distribution based on the laser diffraction method and the BET specific surface area were measured by the same methods as those for the silver powder before treatment with amine in Example 1, and the tap density was calculated by the same method as that for the silver powder before treatment with amine in Example 1. As a result, the particle size distribution was $D_{10}$=1.1 μm, $D_{50}$=2.0 μm, $D_{90}$=3.3 μm and $D_{max}$=7.8 μm. The BET specific surface area was 0.35 m$^2$/g, and the tap density was 4.1 g/cm$^3$.

The silver powder after treatment with amine was used for obtaining a conductive paste by the same method as that in Example 4, except that the amount of the silver powder was 90.2% by weight and that the amount of each of texanol and BCA was 3.1% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 2060 Pa·s at 0.1 rpm, 325 Pa·s at 1 rpm, 100 Pa·s at 5 rpm and 52 Pa·s at 10 rpm, respectively, at 25° C. The value Ti1 was 21, Ti2 was 40 and Ti3 was 3.3. The Casson viscosity η∞ was 8.9 Pa, and the Casson yield value τ0 was 413 Pa·s.

The conductive paste thus obtained was used for forming a coating film by the same method as that in Example 4. The width and thickness of the coating film thus formed were measured by the same methods as those in Example 4. As a result, the line width of the coating film was 62.8 μm, and the sectional area of the coating film was 672 μm$^2$. The thickness of the coating film was 18.9 μm, and the aspect ratio of the cross-section of the coating film was 0.30 (=18.9 μm/62.8 μm). The value of (sectional area/line width) was 10.7 μm.

This coating film was used for producing a conductive film by the same method as that in Example 1. The resistance of the conductive film thus produced was measured by the same method as that in Example 1. As a result, the resistance of the conductive film was 0.578Ω, and the value of (resistance/sectional area) was 0.860 (mΩ/μm$^2$) (=578 (mΩ)/672 (m$^2$)).

Example 25

The same silver powder (the silver powder before treatment with amine) as that in Example 21 was used to be surface-treated with amine by the same method as that in Example 13.

With respect to the silver powder thus treated with amine, the particle size distribution based on the laser diffraction method and the BET specific surface area were measured by the same methods as those for the silver powder before treatment with amine in Example 1, and the tap density was calculated by the same method as that for the silver powder before treatment with amine in Example 1. As a result, the particle size distribution was $D_{10}$=1.2 μm, $D_{50}$=2.1 μm, $D_{90}$=3.8 μm and $D_{max}$=7.8 μm. The BET specific surface area was 0.32 m$^2$/g, and the tap density was 4.4 g/cm$^3$.

The silver powder after treatment with amine was used for obtaining a conductive paste by the same method as that in Example 4, except that the amount of the silver powder was 89.6% by weight and that the amount of each of texanol and BCA was 3.4% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 2740 Pa·s at 0.1 rpm, 421 Pa·s at 1 rpm, 117 Pa·s at 5 rpm and 50 Pa·s at 10 rpm, respectively, at 25° C. The value Ti1 was 23, Ti2 was 55 and Ti3 was 3.6. The Casson viscosity η∞ was 4 Pa, and the Casson yield value τ0 was 603 Pa·s.

The conductive paste thus obtained was used for forming a coating film by the same method as that in Example 4. The width and thickness of the coating film thus formed were measured by the same methods as those in Example 4. As a result, the line width of the coating film was 66.7 μm, and the sectional area of the coating film was 730 μm$^2$. The thickness of the coating film was 20.1 μm, and the aspect ratio of the cross-section of the coating film was 0.30 (=20.1 μm/66.7 μm). The value of (sectional area/line width) was 10.9 μm.

This coating film was used for producing a conductive film by the same method as that in Example 1. The resistance of the conductive film thus produced was measured by the same method as that in Example 1. As a result, the resistance of the conductive film was 0.706Ω, and the value of (resistance/sectional area) was 0.967 (mΩ/μm$^2$) (=706 (mΩ)/730 (μm$^2$)).

Example 26

The same silver powder (the silver powder before treatment with amine) as that in Example 21 was used to be surface-treated with amine by the same method as that in Example 15.

With respect to the silver powder thus treated with amine, the particle size distribution based on the laser diffraction method and the BET specific surface area were measured by the same methods as those for the silver powder before treatment with amine in Example 1, and the tap density was calculated by the same method as that for the silver powder before treatment with amine in Example 1. As a result, the particle size distribution was $D_{10}=1.1$ μm, $D_{50}=2.1$ μm, $D_{90}=3.4$ μm and $D_{max}=9.5$ μm. The BET specific surface area was 0.31 m$^2$/g, and the tap density was 4.0 g/cm$^3$.

The silver powder after treatment with amine was used for obtaining a conductive paste by the same method as that in Example 4. The viscosity of the conductive paste thus obtained was measured by the same method as that in Example 1, and the Casson viscosity η∞ and Casson yield value τ0 thereof were calculated by the same methods as those in Example 1. As a result, the viscosity was 2660 Pa·s at 0.1 rpm, 385 Pa·s at 1 rpm, 108 Pa·s at 5 rpm and 44 Pa·s at 10 rpm, respectively, at 25° C. The value Ti1 was 25, Ti2 was 60 and Ti3 was 3.6. The Casson viscosity η∞ was 3.1 Pa, and the Casson yield value τ0 was 582 Pa·s.

The conductive paste thus obtained was used for forming a coating film by the same method as that in Example 4. The width and thickness of the coating film thus formed were measured by the same methods as those in Example 4. As a result, the line width of the coating film was 66.7 μm, and the sectional area of the coating film was 730 μm$^2$. The thickness of the coating film was 19.1 μm, and the aspect ratio of the cross-section of the coating film was 0.29 (=19.1 μm/66.7 μm). The value of (sectional area/line width) was 10.9 μm.

This coating film was used for producing a conductive film by the same method as that in Example 1. The resistance of the conductive film thus produced was measured by the same method as that in Example 1. As a result, the resistance of the conductive film was 0.608Ω, and the value of (resistance/sectional area) was 0.833 (mΩ/μm$^2$) (=608 (mΩ)/730 (μm$^2$)).

Example 27

The same silver powder (the silver powder before treatment with amine) as that in Example 21 was used to be surface-treated with amine by the same method as that in Example 17.

With respect to the silver powder thus treated with amine, the particle size distribution based on the laser diffraction method and the BET specific surface area were measured by the same methods as those for the silver powder before treatment with amine in Example 1, and the tap density was calculated by the same method as that for the silver powder before treatment with amine in Example 1. As a result, the particle size distribution was $D_{10}=1.1$ μm, $D_{50}=2.1$ μm, $D_{90}=3.4$ μm and $D_{max}=7.8$ μm. The BET specific surface area was 0.28 m$^2$/g, and the tap density was 4.2 g/cm$^3$.

Then, 12 mg of the silver powder after treatment with amine was used for carrying out the component analysis thereof by the same method as that in Example 17. As a result, there were confirmed peaks derived from oleic acid (molecular weight 282), oleylamine (molecular weight 267), oleonitrile (molecular weight 263), octadecylamide (molecular weight 281) and a component of a molecular weight of 531. It is guessed that the peak of the component having the molecular weight of 533 is a peak obtained by removing water molecule (molecular weight 18) from a product obtained by the condensation reaction of oleic acid with oleylamine, so that it is found that an amide is formed by oleic acid and oleylamine. Furthermore, it is considered that oleonitrile is an impurity derived from a chemical reagent of oleylamine and that octadecylamide is a product formed by the reaction of oleic acid with oleylamine.

The silver powder after treatment with amine was used for obtaining a conductive paste by the same method as that in Example 4, except that the amount of the silver powder was 90.8% by weight and that the amount of each of texanol and BCA was 2.8% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 2100 Pa·s at 0.1 rpm, 357 Pa·s at 1 rpm, 114 Pa·s at 5 rpm and 57 Pa·s at 10 rpm, respectively, at 25° C. The value Ti1 was 18, Ti2 was 37 and Ti3 was 3.1. The Casson viscosity η∞ was 11.3 Pa, and the Casson yield value τ0 was 430 Pa·s.

The conductive paste thus obtained was used for forming a coating film by the same method as that in Example 4. The width and thickness of the coating film thus formed were measured by the same methods as those in Example 4. As a result, the line width of the coating film was 66.7 μm, and the sectional area of the coating film was 738 μm$^2$. The thickness of the coating film was 21.0 μm, and the aspect ratio of the cross-section of the coating film was 0.31 (=21.0 μm/66.7 μm). The value of (sectional area/line width) was 11.1 μm.

This coating film was used for producing a conductive film by the same method as that in Example 1. The resistance of the conductive film thus produced was measured by the same method as that in Example 1. As a result, the resistance of the conductive film was 0.734Ω, and the value of (resistance/sectional area) was 1.01 (mΩ/μm$^2$) (=743 (mΩ)/738 (μm$^2$)).

Example 28

The same silver powder (the silver powder before treatment with amine) as that in Example 21 was used to be surface-treated with amine by the same method as that in Example 19.

With respect to the silver powder thus treated with amine, the particle size distribution based on the laser diffraction method and the BET specific surface area were measured by the same methods as those for the silver powder before treatment with amine in Example 1, and the tap density was calculated by the same method as that for the silver powder before treatment with amine in Example 1. As a result, the particle size distribution was $D_{10}=1.2$ μm, $D_{50}=2.3$ μm, $D_{90}=3.8$ μm and $D_{max}=9.3$ μm. The BET specific surface area was 0.28 m$^2$/g, and the tap density was 4.1 g/cm$^3$.

The silver powder after treatment with amine was used for obtaining a conductive paste by the same method as that in Example 4, except that the amount of the silver powder was 90.8% by weight and that the amount of each of texanol and BCA was 2.8% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 2260 Pa·s at 0.1 rpm, 385 Pa·s at 1 rpm, 126 Pa·s at 5 rpm and 55 Pa·s at 10 rpm, respectively, at 25° C. The value Ti1 was 18, Ti2 was 41 and Ti3 was 3.1. The Casson viscosity η∞ was 9.5 Pa, and the Casson yield value τ0 was 487 Pa·s.

The conductive paste thus obtained was used for forming a coating film by the same method as that in Example 4. The width and thickness of the coating film thus formed were measured by the same methods as those in Example 4. As a result, the line width of the coating film was 69.1 μm, and the sectional area of the coating film was 763 μm$^2$. The thickness of the coating film was 19.8 μm, and the aspect ratio of the cross-section of the coating film was 0.29 (=19.8 μm/69.1 μm). The value of (sectional area/line width) was 11.0 μm.

This coating film was used for producing a conductive film by the same method as that in Example 1. The resistance of the conductive film thus produced was measured by the same method as that in Example 1. As a result, the resistance of the conductive film was 0.876Ω, and the value of (resistance/sectional area) was 1.15 (mΩ/μm²) (=876 (mΩ)/763 (μm²)).

Comparative Example 8

With respect to the same silver powder as that in Example 21 (the silver powder before treatment with amine), the particle size distribution based on the laser diffraction method and the BET specific surface area were measured by the same methods as those for the silver powder before treatment with amine in Example 1, and the tap density thereof was calculated by the same method as that for the silver powder before treatment with amine in Example 1. As a result, the particle size distribution was $D_{10}$=1.2 μm, $D_{50}$=2.3 μm, $D_{90}$=3.5 μm and $D_{max}$=7.8 μm. The BET specific surface area was 0.41 m²/g, and the tap density was 5.0 g/cm³.

The above-described silver powder was used for obtaining a conductive paste by the same method as that in Example 4, except that the amount of the silver powder was 89.2% by weight and that the amount of each of texanol and BCA was 3.6% by weight. The viscosity of the conductive paste thus obtained was measured by the same method as that in Example 1, and the Casson viscosity η∞ and Casson yield value τ0 thereof were calculated by the same methods as those in Example 1. As a result, the viscosity was 2060 Pa·s at 0.1 rpm, 373 Pa·s at 1 rpm, 125 Pa·s at 5 rpm and 61 Pa·s at 10 rpm, respectively, at 25 The value Ti1 was 16, Ti2 was 34 and Ti3 was 3.0. The Casson viscosity η∞ was 13.6 Pa, and the Casson yield value τ0 was 428 Pa·s.

The conductive paste thus obtained was used for forming a coating film by the same method as that in Example 4. The width and thickness of the coating film thus formed were measured by the same methods as those in Example 4. As a result, the line width of the coating film was 68.6 μm, and the sectional area of the coating film was 527 μm². The thickness of the coating film was 13.9 μm, and the aspect ratio of the cross-section of the coating film was 0.20 (=13.9 μm/68.6 μm). The value of (sectional area/line width) was 7.7 μm.

This coating film was used for producing a conductive film by the same method as that in Example 1. The resistance of the conductive film thus produced was measured by the same method as that in Example 1. As a result, the resistance of the conductive film was 0.637Ω, and the value of (resistance/sectional area) was 1.21 (mΩ/μm²) (=637 (mΩ)/527 (μm²)).

The results in Examples 21-28 and Comparative Example 8 are shown in Tables 9-11.

TABLE 9

| | Dispersing Agent | Surface Treatment Agent | | Particle Size after Surface Treatment (μm) | | | | BET (m²/g) | TAP (g/cm³) |
|---|---|---|---|---|---|---|---|---|---|
| | | Kind | Amount (wt %) | $D_{10}$ | $D_{50}$ | $D_{90}$ | $D_{max}$ | | |
| Ex. 21 | oleic acid | IBA | 0.5 | 1.1 | 2.0 | 3.3 | 9.3 | 0.37 | 5.0 |
| Ex. 22 | | OCA | 0.5 | 1.2 | 2.3 | 3.8 | 9.3 | 0.35 | 4.3 |
| Ex. 23 | | DA | 0.5 | 1.1 | 2.1 | 3.8 | 7.8 | 0.36 | 4.2 |
| Ex. 24 | | DDA | 0.5 | 1.1 | 2.0 | 3.3 | 7.8 | 0.35 | 4.1 |
| Ex. 25 | | HDA | 0.5 | 1.2 | 2.1 | 3.8 | 7.8 | 0.32 | 4.4 |
| Ex. 26 | | ODA | 0.5 | 1.1 | 2.1 | 3.4 | 9.5 | 0.31 | 4.0 |
| Ex. 27 | | OLA | 0.5 | 1.1 | 2.1 | 3.4 | 7.8 | 0.28 | 4.2 |
| Ex. 28 | | 2EHOPA | 0.5 | 1.2 | 2.3 | 3.8 | 9.3 | 0.28 | 4.1 |
| Comp. 8 | | — | — | 1.2 | 2.3 | 3.5 | 7.8 | 0.41 | 5.0 |

IBA: isobutylamine,
OCA: octylamine,
DA: decylamine,
DDA: dodecylamine,
HAD: hexadecylamine,
ODA: octadecylamine,
OLA: oleylamine,
2EHOPA: 2-ethylhexyloxypropylamine

TABLE 10

| | Viscosity (Pa · s) | | | | | | | Casson Viscosity (Pa) | Casson Yield Value (Pa · s) |
|---|---|---|---|---|---|---|---|---|---|
| | 0.1 rpm | 1 rpm | 5 rpm | 10 rpm | Ti1 | Ti2 | Ti3 | | |
| Ex. 21 | 2460 | 401 | 129 | 55 | 19 | 45 | 3.1 | 8.5 | 529 |
| Ex. 22 | 2200 | 314 | 108 | 51 | 17 | 38 | 2.9 | 8.7 | 429 |
| Ex. 23 | 2420 | 413 | 121 | 65 | 20 | 37 | 3.4 | 11.8 | 495 |
| Ex. 24 | 2060 | 325 | 100 | 52 | 21 | 40 | 3.3 | 8.9 | 413 |
| Ex. 25 | 2740 | 421 | 117 | 50 | 23 | 55 | 3.6 | 4 | 603 |
| Ex. 26 | 2660 | 385 | 108 | 44 | 25 | 60 | 3.6 | 3.1 | 582 |
| Ex. 27 | 2100 | 357 | 114 | 57 | 18 | 37 | 3.1 | 11.3 | 430 |
| Ex. 28 | 2260 | 385 | 126 | 55 | 18 | 41 | 3.1 | 9.5 | 487 |
| Comp. 8 | 2060 | 373 | 125 | 61 | 16 | 34 | 3.0 | 13.6 | 428 |

TABLE 11

|  | Line Width (μm) | Thickness (μm) | Aspect Ratio | Sectional Area (μm²) | Sectional Area/Line Width (μm) | Resistance (Ω) | Resistance/Sectional Area (mΩ/μm²) |
|---|---|---|---|---|---|---|---|
| Ex. 21 | 62.9 | 17.5 | 0.28 | 662 | 10.5 | 0.754 | 1.14 |
| Ex. 22 | 64.3 | 22.3 | 0.35 | 721 | 11.2 | 0.662 | 0.918 |
| Ex. 23 | 64.8 | 21.0 | 0.32 | 715 | 11.0 | 0.756 | 1.06 |
| Ex. 24 | 62.8 | 18.9 | 0.30 | 672 | 10.7 | 0.578 | 0.860 |
| Ex. 25 | 66.7 | 20.1 | 0.30 | 730 | 10.9 | 0.706 | 0.967 |
| Ex. 26 | 66.7 | 19.1 | 0.29 | 730 | 10.9 | 0.608 | 0.833 |
| Ex. 27 | 66.7 | 21.0 | 0.31 | 738 | 11.1 | 0.743 | 1.01 |
| Ex. 28 | 69.1 | 19.8 | 0.29 | 763 | 11.0 | 0.876 | 1.15 |
| Comp. 8 | 68.6 | 13.9 | 0.20 | 527 | 7.7 | 0.637 | 1.21 |

After 86.2% by weight of each of the silver powders in Examples 13, 14 and 16-18, 1.2% by weight of ethyl cellulose (produced by Wako Pure Chemical Industries, Ltd.), a mixed solvent containing texanol (produced by JMC Co., Ltd.) and butyl carbitol acetate (BCA) (produced by Wako Pure Chemical Industries, Ltd.) at 1:1 (the content of each of texanol and BCA was 3.5% by weight), and 1.5% by weight of a glass frit (ASF-1898B produced by Asahi Glass Co., Ltd.), 0.1% by weight of bismuth oxide (produced by DOWA Hightech Co., Ltd.), 0.2% by weight of magnesium stearate (produced by Wako Pure Chemical Industries, Ltd.), 0.5% by weight of oleic acid (produced by Wako Pure Chemical Industries, Ltd.) and 3.2% by weight of tellurium dioxide (produced by Wako Pure Chemical Industries, Ltd.) serving as additives were mixed (preliminarily kneaded) by means of a planetary centrifugal vacuum degassing mixer (Awatori Rentaro produced by Thinky Corporation), the obtained mixture was kneaded by means of a three-roll mill (EXAKT 80S produced by Otto Hermann Inc.) to obtain a conductive paste.

Then, each of the silver powders in Example 15, 19 and Comparative Example 6-7 was used for obtaining a conductive paste by the same method as the above-described method, except that the amount of the silver powder was 86.0% by weight and the amount of each of texanol and BCA was 3.6% by weight in Example 15, that the amount of the silver powder was 85.2% by weight, the amount of each of texanol and BCA was 4.1% by weight, the amount of the glass frit was 1.5% by weight and the amount of tellurium dioxide was 3.1% by weight in Example 19, that the amount of the silver powder was 85.4% by weight, the amount of each of texanol and BCA was 4.0% by weight, the amount of the glass frit was 1.5% by weight and the amount of tellurium dioxide was 3.1% by weight in Comparative Example 6, and that the amount of the silver powder was 85.8% by weight and the amount of each of texanol and BCA was 3.7% by weight in Comparative Example 7.

Then, eight silicon wafers (produced by E&M Co., Ltd, 80 Ω/square, 6 inches monocrystal) were prepared. After an aluminum paste (ALSOLAR 14-7021 (containing Pb) produced by Toyo Aluminum K.K.) was printed on the backside of each of the silicon wafers in form of the solid filling having a length of 154 mm by means of a screen printing machine (MT-320T produced by Micro-tech Co., Ltd.), it was dried at 200° C. for 10 minutes by means of a hot air type dryer. Then, after the above-described conductive paste (each of the conductive pastes produced using the silver pastes in Examples 13-19 and Comparative Example 6-7) was printed on the surface (front side) of each of the silicon wafers in the shape of 100 finger electrodes, each having a width of 50 μm, and in the shape of three busbar electrodes, each having a width of 1.3 mm, by means of the screen printing machine (MT-320T produced by Micro-tech Co., Ltd.), it was dried at 200° C. for 10 minutes by means of the hot air type dryer, and then, it was fired at a peak temperature of 820° C. for an in-out time of 21 seconds in a fast firing IR furnace (Fast Firing Test Four-Chamber Furnace produced by NGK Insulators Ltd.) to produce a solar cell.

The thickness, line width and sectional area of the three busbar electrodes of each of the solar cells were measured by a contact surface roughness tester (SE-30D produced by Kosaka Laboratory Ltd.) to obtain the aspect ratio (thickness/line width) of the cross-section thereof. As a result, the sectional area was 662 μm² (Example 13), 680 μm² (Example 14), 540 μm² (Example 15), 678 μm² (Example 16), 733 μm² (Example 17), 725 μm² (Example 18), 548 μm² (Example 19), 456 μm² (Comparative Example 6) and 805 μm² (Comparative Example 7), respectively. Assuming that the aspect ratio of the cross-section of the busbar electrodes using the paste in Comparative Example 6 is 100, the relative value of the aspect ratio of the cross-section of the busbar electrodes using the paste in each of the examples is 117.0 (Example 13), 128.6 (Example 14), 110.3 (Example 15), 115.7 (Example 16), 114.9 (Example 17), 125.4 (Example 18), 118.8 (Example 19) and 96.5 (Comparative Example 7), respectively.

Then, a battery characteristic test was carried out by irradiating the above-described solar cell with pseudo sunlight having a light irradiation energy of 100 mWcm² by means of a xenon lamp of a solar simulator (produced by Wacom Electric Co., Ltd.). As a result, assuming that the power generation efficiency Eff (a value obtained by multiplying a divided value with 100, the divided value being obtained by dividing the maximum output $P_{max}$ by the amount of irradiation light (W) (per 1 cm²)) of the solar cell produced using the paste in Comparative Example 6 is 100, the relative value of the power generation efficiency Eff of the solar cell produced using the paste in each of the examples is 100.7 (Example 13), 100.9 (Example 14), 101.3 (Example 15), 100.8 (Example 16), 101.1 (Example 17), 101.5 (Example 18), 100.6 (Example 19) and 99.8 (Comparative Example 7), respectively.

The invention claimed is:
1. A silver powder, the surface of which is coated with a fatty acid, an aliphatic amine and an aliphatic amide,
wherein a ratio (thixotropic ratio) of a viscosity of a kneaded mixture at 1 rpm to a viscosity of the kneaded mixture at 5 rpm is not less than 3.5 when the viscosities are measured at 25° C. by means of an E-type viscometer, the kneaded mixture being obtained by kneading 89.8% by weight of said silver powder, 0.6% by weight of ethyl cellulose, 6.5% by weight of texanol, 1.0% by weight of a glass frit and 2.0% by weight of zinc oxide.

2. A silver powder as set forth in claim 1, wherein said surface is coated with said fatty acid, and said aliphatic amine is formed on the outermost of the silver powder, said aliphatic amide being formed between said fatty acid and said aliphatic amine.

3. A silver powder as set forth in claim 1, wherein said aliphatic amine is at least one selected from the group consisting of isobutylamine, octylamine, decylamine, dodecylamine, hexadecylamine, octadecylamine, oleylamine, 2-ethylhexyloxypropylamine and 3-lauryloxypropylamine.

4. A silver powder as set forth in claim 1, wherein said fatty acid is stearic acid or oleic acid.

5. A silver powder as set forth in claim 1, wherein said kneaded mixture has a Casson yield value of not less than 520 Pa·s.

6. A conductive paste using a silver powder as set forth in claim 1, as a conductor.

7. A conductive paste comprising a solvent, a resin and a conductive powder which is a silver powder as set forth in claim 1.

8. A silver powder, the surface of which is coated with a fatty acid, an aliphatic amine and an aliphatic amide,
wherein a kneaded mixture has a Casson yield value of not less than 520 Pa·s, the kneaded mixture being obtained by kneading 89.8% by weight of said silver powder, 0.6% by weight of ethyl cellulose, 6.5% by weight of texanol, 1.0% by weight of a glass frit and 2.0% by weight of zinc oxide.

9. A silver powder as set forth in claim 8, wherein said surface is coated with said fatty acid, and said aliphatic amine is formed on the outermost of the silver powder, said aliphatic amide being formed between said fatty acid and said aliphatic amine.

10. A silver powder as set forth in claim 8, wherein said aliphatic amine is at least one selected from the group consisting of isobutylamine, octylamine, decylamine, dodecylamine, hexadecylamine, octadecylamine, oleylamine, 2-ethylhexyloxypropylamine and 3-lauryloxypropylamine.

11. A silver powder as set forth in claim 8, wherein said fatty acid is stearic acid or oleic acid.

12. A conductive paste using a silver powder as set forth in claim 8, as a conductor.

13. A conductive paste comprising a solvent, a resin and a conductive powder which is a silver powder as set forth in claim 8.

14. A silver powder, the surface of which is coated with a fatty acid, an aliphatic amine and an aliphatic amide,
wherein a ratio (thixotropic ratio) of a viscosity of a kneaded mixture at 0.1 rpm to a viscosity of the kneaded mixture at 10 rpm is not less than 30 when the viscosities are measured at 25° C. by means of an E-type viscometer, the kneaded mixture being obtained by kneading 89.3 to 91.0% by weight of said silver powder, 0.6% by weight of ethyl cellulose, 1.0% by weight of a glass frit, 2.0% by weight of zinc oxide and the rest being a mixed solvent containing texanol and butyl carbitol acetate at 1:1.

15. A silver powder as set forth in claim 14, wherein said kneaded mixture has a Casson yield value of not less than 340 Pa·s.

16. A silver powder as set forth in claim 14, wherein said surface is coated with said fatty acid, and said aliphatic amine is formed on the outermost of the silver powder, said aliphatic amide being formed between said fatty acid and said aliphatic amine.

17. A silver powder as set forth in claim 14, wherein said aliphatic amine is at least one selected from the group consisting of isobutylamine, octylamine, decylamine, dodecylamine, hexadecylamine, octadecylamine, oleylamine, 2-ethylhexyloxypropylamine and 3-lauryloxypropylamine.

18. A silver powder as set forth in claim 14, wherein said fatty acid is stearic acid or oleic acid.

19. A conductive paste using a silver powder as set forth in claim 14, as a conductor.

20. A conductive paste comprising a solvent, a resin and a conductive powder which is a silver powder as set forth in claim 14.

21. A method for producing an electrode for a solar cell, the method comprising the steps of:
applying a conductive paste as set forth in claim 6 on a surface of a substrate; and
firing the conductive paste to form an electrode on the surface of the substrate.

22. A method for producing an electrode for a solar cell, the method comprising the steps of:
applying a conductive paste as set forth in claim 12 on a surface of a substrate; and
firing the conductive paste to form an electrode on the surface of the substrate.

23. A method for producing an electrode for a solar cell, the method comprising the steps of:
applying a conductive paste as set forth in claim 19 on a surface of a substrate; and
firing the conductive paste to form an electrode on the surface of the substrate.

* * * * *